United States Patent
Onose

(10) Patent No.: US 11,025,026 B2
(45) Date of Patent: Jun. 1, 2021

(54) LASER SYSTEM

(71) Applicant: Gigaphoton Inc., Tochigi (JP)

(72) Inventor: Takashi Onose, Tochigi (JP)

(73) Assignee: Gigaphoton Inc., Tochigi (JP)

(*) Notice: Subject to any disclaimer, the term of this patent is extended or adjusted under 35 U.S.C. 154(b) by 0 days.

(21) Appl. No.: 16/429,434

(22) Filed: Jun. 3, 2019

(65) Prior Publication Data

US 2019/0288472 A1    Sep. 19, 2019

Related U.S. Application Data

(63) Continuation of application No. PCT/JP2017/002628, filed on Jan. 26, 2017.

(51) Int. Cl.
| | |
|---|---|
| *H01S 3/23* | (2006.01) |
| *H01S 3/00* | (2006.01) |
| *G02B 27/09* | (2006.01) |
| *G02B 27/10* | (2006.01) |
| *H01S 5/00* | (2006.01) |
| *H01S 3/10* | (2006.01) |
| *H01S 3/225* | (2006.01) |

(52) U.S. Cl.
CPC ........ *H01S 3/0085* (2013.01); *G02B 27/0983* (2013.01); *G02B 27/10* (2013.01); *H01S 3/0057* (2013.01); *H01S 3/10* (2013.01); *H01S 3/2308* (2013.01); *H01S 5/005* (2013.01); *H01S 3/2251* (2013.01); *H01S 2301/08* (2013.01); *H01S 2301/20* (2013.01)

(58) Field of Classification Search
CPC .. H01S 3/2308; H01S 3/0057; H01S 2301/08; G02B 27/48; G03F 7/70025
See application file for complete search history.

(56) References Cited

U.S. PATENT DOCUMENTS

| | | | |
|---|---|---|---|
| 5,153,773 A | 10/1992 | Muraki et al. | |
| 5,454,004 A * | 9/1995 | Leger | G02B 5/1871 372/102 |
| 5,742,634 A * | 4/1998 | Rieger | H01S 3/115 372/103 |

(Continued)

FOREIGN PATENT DOCUMENTS

| | | |
|---|---|---|
| CN | 101939880 A | 1/2011 |
| CN | 104184032 A | 12/2014 |

(Continued)

OTHER PUBLICATIONS

International Search Report issued in PCT/JP2017/002628; dated Apr. 25, 2017.

(Continued)

*Primary Examiner* — Michael Carter
(74) *Attorney, Agent, or Firm* — Studebaker & Brackett PC

(57) ABSTRACT

A laser system including: A. a laser apparatus configured to output a pulse laser beam; B. an optical pulse stretcher including a delay optical path for expanding a pulse width of the pulse laser beam; and C. a phase optical element included in the delay optical path and having a function of spatially and randomly shifting a phase of the pulse laser beam. The phase optical element includes a plurality of types of cells providing different amounts of phase shift to the pulse laser beam and arranged irregularly in any direction.

5 Claims, 25 Drawing Sheets

(56) References Cited

U.S. PATENT DOCUMENTS

| | | |
|---|---|---|
| 6,238,063 B1 | 5/2001 | Tanitsu et al. |
| 8,199,398 B2 | 6/2012 | Fermann et al. |
| 9,882,343 B2 | 1/2018 | Moriya et al. |
| 2005/0141583 A1 | 6/2005 | Sandstrom |
| 2012/0076504 A1 | 3/2012 | Dantus et al. |
| 2012/0250709 A1 | 10/2012 | Watanabe et al. |
| 2012/0250710 A1 | 10/2012 | Yoshino et al. |

FOREIGN PATENT DOCUMENTS

| | | | |
|---|---|---|---|
| JP | H03-215930 A | | 9/1991 |
| JP | H04-261083 A | | 9/1992 |
| JP | H09-512959 A | | 12/1997 |
| JP | 2760159 B2 | | 5/1998 |
| JP | H11-312631 A | | 11/1999 |
| JP | 2005-537658 A | | 12/2005 |
| JP | 2011-176358 A | | 9/2011 |
| JP | 2011-192849 A | | 9/2011 |
| JP | 2011192849 | * | 9/2011 |
| JP | 2012-156531 A | | 8/2012 |
| JP | 2012-204819 A | | 10/2012 |
| JP | 2012-204820 A | | 10/2012 |
| WO | 95/31024 A2 | | 11/1995 |
| WO | 2007/053335 A2 | | 5/2007 |
| WO | 2016/084263 A1 | | 6/2016 |

OTHER PUBLICATIONS

International Preliminary Report on Patentability and Written Opinion issued in PCT/JP2017/002628; dated Jul. 30, 2019.

An Office Action issued by the China National Intellectual Property Administration dated Sep. 2, 2020, which corresponds to Chinese Patent Application No. 201780073845.5 and is related to U.S. Appl. No. 16/429,434 with English language translation.

An Office Action; "Notification of Reasons for Refusal," mailed by the Japanese Patent Office dated Feb. 15, 2021, which corresponds to Japanese Patent Application No. 2018-564004 and is related to U.S. Appl. No. 16/429,434; with English language translation.

* cited by examiner

LASER SYSTEM

CROSS-REFERENCE TO RELATED APPLICATIONS

The present application is a continuation application of International Application No. PCT/JP2017/002628 filed on Jan. 26, 2017. The content of the application is incorporated herein by reference in its entirety.

BACKGROUND

1. Technical Field

The present disclosure relates to a laser system.

2. Related Art

Improvements in resolution of semiconductor exposure apparatuses (hereinafter simply referred to as "exposure apparatuses") have been desired due to miniaturization and high integration of semiconductor integrated circuits. For this purpose, exposure light sources that output light with shorter wavelengths have been developed. As the exposure light source, a gas laser apparatus is used instead of a conventional mercury lamp. As the laser apparatus for exposure, a KrF excimer laser apparatus that outputs ultraviolet light with a wavelength of 248 nm and an ArF excimer laser apparatus that outputs ultraviolet light with a wavelength of 193.4 nm are currently used.

In current exposure technology, immersion exposure is practically used in which a gap between a projection lens of an exposure apparatus and a wafer is filled with a liquid to change a refractive index of the gap, thereby reducing an apparent wavelength of light from an exposure light source. When the immersion exposure is performed using the ArF excimer laser apparatus as the exposure light source, the wafer is irradiated with ultraviolet light with a wavelength of 134 nm in water. This technology is referred to as ArF immersion exposure. The ArF liquid immersion exposure is also referred to as ArF immersion lithography.

The KrF excimer laser apparatus and the ArF excimer laser apparatus have a large spectral line width of spontaneous oscillation in the range of about 350 to 400 pm. Thus, chromatic aberration occurs of a laser beam (ultraviolet light) reduced and projected on a wafer by a projection lens of an exposure apparatus, thereby reducing resolution. Then, the spectral line width of the laser beam output from the gas laser apparatus needs to be narrowed to the extent that the chromatic aberration can be ignored. For this purpose, a line narrowing module (LNM) having a line narrowing element is provided in a laser resonator of the gas laser apparatus. The line narrowing module achieves narrowing of the spectral line width. The line narrowing element may include etalon, grating, or the like. Such a laser apparatus in which the spectrum line width is narrowed is referred to as a line narrowing laser apparatus.

The laser apparatus also uses an optical pulse stretcher that expands a pulse width of a laser beam so as to reduce damage to an optical system in the exposure apparatus. The optical pulse stretcher divides the laser beam output from the laser apparatus into a plurality of pulse beams with time differences to reduce a peak power level of each pulse beam.

LIST OF DOCUMENTS

Patent Documents

Patent Document 1: Japanese Unexamined Patent Application Publication No. 2011-176358
Patent Document 2: Japanese Patent No. 2760159
Patent Document 3: Japanese Unexamined Patent Application Publication No. 11-312631
Patent Document 4: Japanese Unexamined Patent Application Publication No. 2012-156531
Patent Document 5: Japanese Unexamined Patent Application Publication No. 3-215930
Patent Document 6: Japanese Unexamined Patent Application Publication No. 2012-204819
Patent Document 7: Japanese Unexamined Patent Application Publication No. 2011-192849

SUMMARY

A laser system according to one aspect of the present disclosure includes:
A. a laser apparatus configured to output a pulse laser beam;
B. an optical pulse stretcher including a delay optical path for expanding a pulse width of the pulse laser beam; and
C. a phase optical element included in the delay optical path and having a function of spatially and randomly shifting a phase of the pulse laser beam.

A laser system according to another aspect of the present disclosure includes:
A. a laser apparatus configured to output a pulse laser beam;
B. an amplifier including an optical resonator and configured to amplify the pulse laser beam output from the laser apparatus; and
C. a first phase optical element included in an optical path of the optical resonator and having a function of spatially and randomly shifting a phase of the pulse laser beam.

BRIEF DESCRIPTION OF THE DRAWINGS

With reference to the accompanying drawings, some embodiments of the present disclosure will be described below merely by way of example.

DESCRIPTION OF EMBODIMENTS

<Contents>
1. Comparative example
   1.1 Configuration
   1.2 Operation
   1.3 Definition of pulse width
   1.4 Problem
      1.4.1 Reduction in coherence due to spatial division
      1.4.2 Reduction in coherence due to random phase plate
2. First embodiment
   2.1 Configuration
   2.2 Operation
   2.3 Effect
   2.4 Variant
3. Second embodiment
   3.1 Configuration
   3.2 Operation
   3.3 Effect
   3.4 Variant
4. Third embodiment
   4.1 Configuration
   4.2 Operation
   4.3 Effect
   4.4 Variant
5. Fourth embodiment
   5.1 Configuration
   5.2 Operation
   5.3 Effect
   5.4 Variant
6. Fifth embodiment
   6.1 Configuration
   6.2 Operation
   6.3 Effect
   6.4 Variant
7. Sixth embodiment
   7.1 Configuration
   7.2 Operation
   7.3 Effect
   7.4 Variant
8. Seventh embodiment
   8.1 Configuration
   8.2 Operation
   8.3 Effect
   8.4 Variant
9. Eighth embodiment
   9.1 Configuration
   9.2 Operation
   9.3 Effect
   9.4 Variant
10. Ninth embodiment
   10.1 Configuration
   10.2 Operation
   10.3 Effect
   10.4 Variant
11. Tenth embodiment
   11.1 Configuration
   11.2 Operation
   11.3 Effect
   11.4 Variant
12. Variant of ring resonator Now, with reference to the drawings, embodiments of the present disclosure will be described in detail. The embodiments described below illustrate some examples of the present disclosure, and do not limit contents of the present disclosure. Also, all configurations and operations described in the embodiments are not necessarily essential as configu-

1. Comparative Example

1.1 Configuration

Figure 1:
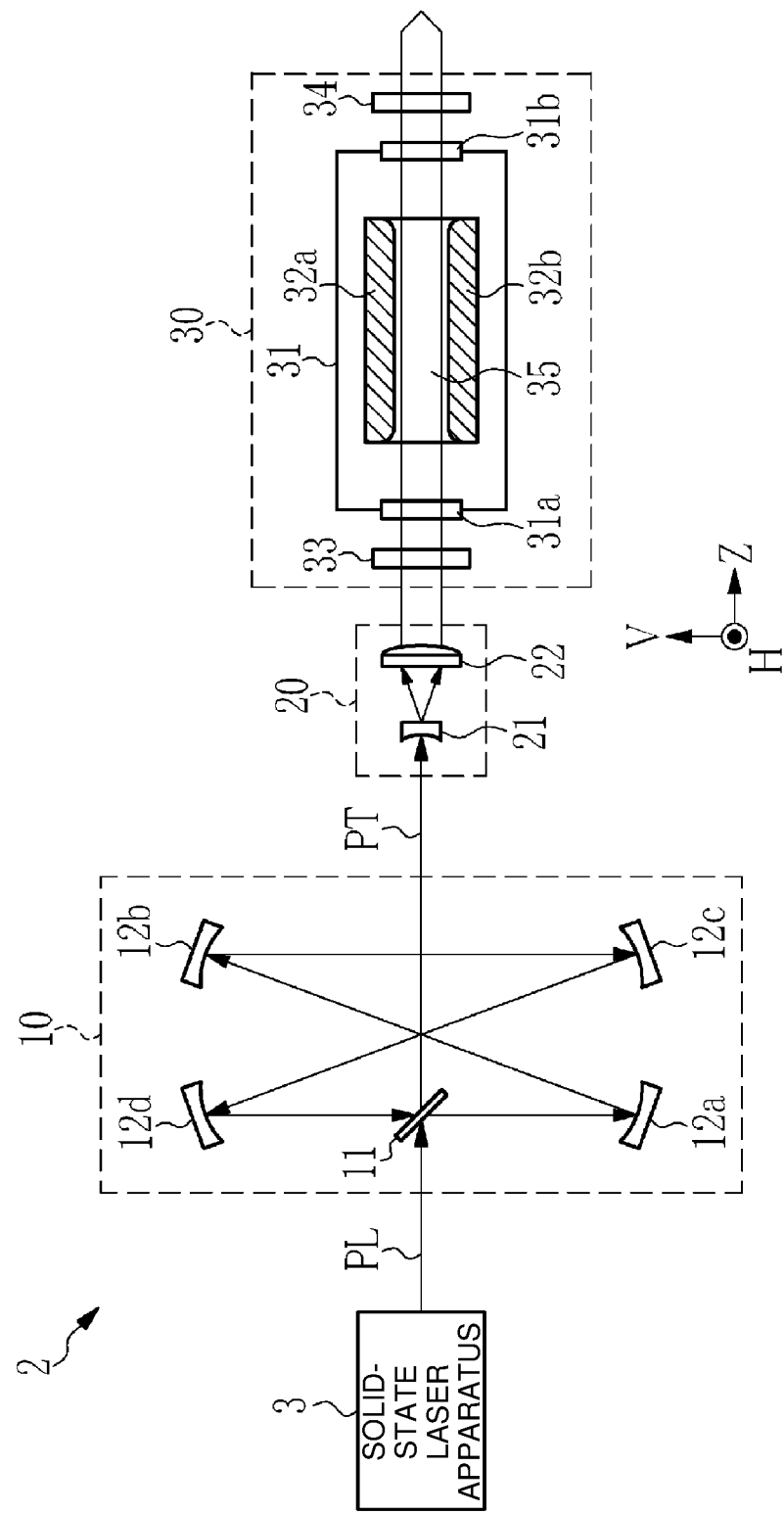
FIG. 1 schematically shows a configuration of a laser system according to a comparative example.

FIG. 1 schematically shows a configuration of a laser system 2 according to a comparative example. In FIG. 1, the laser system 2 includes a solid-state laser apparatus 3 as a master oscillator, an optical pulse stretcher (OPS) 10, a beam expander 20, and an amplifier 30.

The solid-state laser apparatus 3 includes a semiconductor laser, an amplifier, a nonlinear crystal, and the like (not shown). The solid-state laser apparatus 3 outputs a pulse laser beam PL in a single transverse mode. The pulse laser beam PL is a Gaussian beam having, for example, a central wavelength of 193.1 nm to 193.5 nm and a spectral line width of about 0.3 pm. The solid-state laser apparatus 3 may include a titanium sapphire laser that outputs a pulse laser beam with a narrowed line width having a central wavelength of about 773.4 nm, and a nonlinear crystal that outputs a quadruple harmonic.

The OPS 10 includes a beam splitter 11 and first to fourth concave mirrors 12a to 12d. The beam splitter 11 is a partial reflection mirror. Reflectivity of the beam splitter 11 is preferably in the range of 40% to 70%, and more preferably about 60%. The beam splitter 11 is arranged on an optical path of the pulse laser beam PL output from the solid-state laser apparatus 3. The beam splitter 11 transmits one part of the entering pulse laser beam PL and reflects the other part of the pulse laser beam PL.

The first to fourth concave mirrors 12a to 12d constitute a delay optical path for expanding a pulse width of the pulse laser beam PL. The first to fourth concave mirrors 12a to 12d all have mirror surfaces with the same curvature radius R. The first and second concave mirrors 12a, 12b are arranged so that a beam reflected by the beam splitter 11 is highly reflected by the first concave mirror 12a and enters the second concave mirror 12b. The third and fourth concave mirrors 12c, 12d are arranged so that a beam highly reflected by the second concave mirror 12b is highly reflected by the third concave mirror 12c, further highly reflected by the fourth concave mirror 12d, and again enters the beam splitter 11.

A distance between the beam splitter 11 and the first concave mirror 12a and a distance between the fourth concave mirror 12d and the beam splitter 11 each are half of the curvature radius R, that is, R/2. A distance between the first concave mirror 12a and the second concave mirror 12b, a distance between the second concave mirror 12b and the third concave mirror 12c, and a distance between the third concave mirror 12c and the fourth concave mirror 12d each are the same as the curvature radius R.

The first to fourth concave mirrors 12a to 12d all have a same focal length F. The focal length F is half of the curvature radius R, that is, F=R/2. Thus, an optical path length $L_{OPS}$ of the delay optical path constituted by the first to fourth concave mirrors 12a to 12d is eight times as long as the focal length F. Specifically, the OPS 10 has a relationship of $L_{OPS}=8F$.

Figure 2:
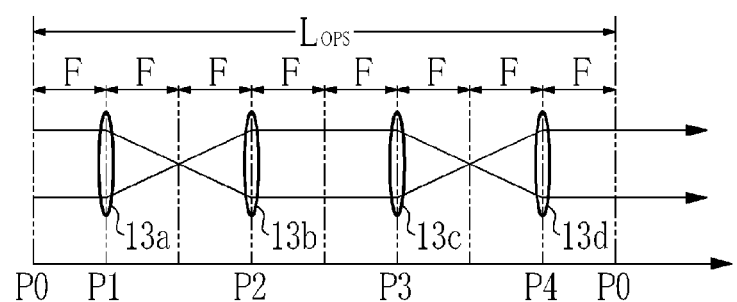
FIG. 2 illustrates a positional relationship of a beam splitter and first to fourth concave mirrors.

FIG. 2 illustrates a positional relationship of the beam splitter 11 and the first to fourth concave mirrors 12a to 12d. In FIG. 2, the first to fourth concave mirrors 12a to 12d are replaced by convex lenses 13a to 13d each having the focal length F. P0 represents a position of the beam splitter 11. P1 to P4 represent positions of the first to fourth concave mirrors 12a to 12d, respectively.

The delay optical system constituted by the first to fourth concave mirrors 12a to 12d is a collimator optical system. Thus, if a beam entering the first concave mirror 12a is a collimated beam, a beam emitted from the fourth concave mirror 12d is a collimated beam.

The first to fourth concave mirrors 12a to 12d are arranged so that the optical path length $L_{OPS}$ is equal to or longer than a temporal coherence length $L_C$ of the pulse laser beam PL. The temporal coherence length $L_C$ is calculated based on a relational expression of $L_C=\lambda^2/\Delta\lambda$, where $\lambda$ is a central wavelength of the pulse laser beam PL, and $\Delta\lambda$ is a spectral line width of the pulse laser beam PL. For example, for $\lambda=193.35$ nm and $\Delta\lambda=0.3$ pm, $L_C=0.125$ m is satisfied.

The beam expander 20 is arranged on an optical path of an expanded pulse laser beam PT output from the OPS 10. The expanded pulse laser beam PT is the pulse laser beam PL with its pulse width expanded by the OPS 10. The beam expander 20 includes a concave lens 21 and a convex lens 22. The beam expander 20 expands a diameter of the expanded pulse laser beam PT input from the OPS 10 and outputs the expanded pulse laser beam PT.

The amplifier 30 is arranged on the optical path of the expanded pulse laser beam PT output from the beam expander 20. The amplifier 30 is an excimer laser apparatus including a laser chamber 31, a pair of discharge electrodes 32a, 32b, a rear mirror 33, and an output coupling mirror 34. The rear mirror 33 and the output coupling mirror 34 constitute a Fabry-Perot resonator as an optical resonator. The rear mirror 33 and the output coupling mirror 34 are coated with partial reflection films that partially reflect a beam having a laser oscillation wavelength. Reflectivity of the partial reflection film of the rear mirror 33 is in the range of 80% to 90%. Reflectivity of the partial reflection film of the output coupling mirror 34 is in the range of 20% to 40%.

The laser chamber 31 is filled with a laser medium such as an ArF laser gas. The discharge electrodes 32a, 32b are arranged in the laser chamber 31 as electrodes for exciting the laser medium due to discharge. Between the discharge electrodes 32a, 32b, a high-voltage pulse is applied from a power supply (not shown).

A traveling direction of the expanded pulse laser beam PT output from the beam expander 20 is hereinafter referred to as a Z direction. A discharge direction between the discharge electrodes 32a, 32b is referred to as a V direction. The V direction is perpendicular to the Z direction. A direction orthogonal to the Z direction and the V direction is referred to as an H direction.

Windows 31a, 31b are provided at opposite ends of the laser chamber 31. The windows 31a, 31b are, for example, parallel plane substrates made of calcium fluoride ($CaF_2$). The windows 31a, 31b are arranged so that an incident angle of the expanded pulse laser beam PT is a Brewster's angle. The expanded pulse laser beam PT output from the beam expander 20 passes through the rear mirror 33 and the window 31a and enters a discharge space 35 between the discharge electrodes 32a, 32b as a seed beam. A width of the discharge space 35 in the V direction is substantially equal to the diameter of the beam expanded by the beam expander 20.

The solid-state laser apparatus 3 and the amplifier 30 are controlled by a synchronization controller (not shown). The amplifier 30 is controlled by the synchronization controller so that the expanded pulse laser beam PT discharges at timing when it enters the discharge space 35.

1.2 Operation

Next, an operation of the laser system 2 according to the comparative example will be described. First, the pulse laser beam PL output from the solid-state laser apparatus 3 enters the beam splitter 11 in the OPS 10. One part of the pulse laser beam PL having entered the beam splitter 11 passes through the beam splitter 11 and is output from the OPS 10 as a zero-time circulation beam $PS_0$ that has not circulated through the delay optical path.

The other part of the pulse laser beam PL having entered the beam splitter 11 is reflected by the beam splitter 11, enters the delay optical path, and is highly reflected by the first concave mirror 12a and the second concave mirror 12b. An optical image of the beam reflected by the beam splitter 11 is formed as a first transfer image at the same magnification by the first and second concave mirrors 12a, 12b. Then, a second transfer image at the same magnification is formed on a position of the beam splitter 11 by the third and fourth concave mirrors 12c, 12d.

One part of the beam having entered the beam splitter 11 as the second transfer image is reflected by the beam splitter 11 and output from the OPS 10 as a one-time circulation beam $PS_1$ having once circulated through the delay optical path. The one-time circulation beam $PS_1$ is output with a delay time $\Delta t$ from the zero-time circulation beam $PS_0$. $\Delta t$ is expressed by $\Delta t = L_{OPS}/c$, where c is a light speed.

The other part of the beam having entered the beam splitter 11 as the second transfer image passes through the beam splitter 11, again enters the delay optical path, is highly reflected by the first to fourth concave mirrors 12a to 12d, and again enters the beam splitter 11. The beam reflected by the beam splitter 11 is output from the OPS 10 as a two-times circulation beam $PS_2$ having twice circulated through the delay optical path. The two-times circulation beam $PS_2$ is output with the delay time $\Delta t$ from the one-time circulation beam $PS_1$.

Then, the circulation of the beam through the delay optical path is repeated, and thus pulse beams such as a three-times circulation beam $PS_3$, a four-times circulation beam $PS_4$, ... are output in order from the OPS 10. The pulse beams output from the OPS 10 with a larger number of times of circulation through the delay optical path have lower optical intensity.

Figure 3:
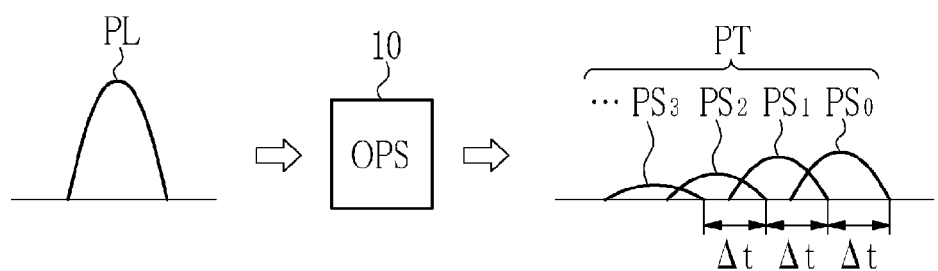
FIG. 3 illustrates beams output from an optical pulse stretcher (OPS).

As shown in FIG. 3, the pulse laser beam PL enters the OPS 10, and is thus divided into the plurality of pulse beams $PS_0$, $PS_1$, $PS_2$, ... with time differences and output. In FIG. 3, the horizontal axis represents time and the vertical axis represents optical intensity. The expanded pulse laser beam PT is a combination of the plurality of pulse beams $PS_n$ resulting from the pulse laser beam PL divided by the OPS 10. Here, n=0, 1, 2, ..., and n is the number of times of circulation through the delay optical path.

Since the optical path length $L_{OPS}$ is equal to or longer than the temporal coherence length $L_C$, mutual coherence of the plurality of pulse beams $PS_n$ is reduced. This reduces coherence of the expanded pulse laser beam PT constituted by the plurality of pulse beams $PS_n$.

The expanded pulse laser beam PT output from the OPS 10 enters the beam expander 20 and is output with the diameter expanded by the beam expander 20. The expanded pulse laser beam PT output from the beam expander 20 enters the amplifier 30. The expanded pulse laser beam PT having entered the amplifier 30 passes through the rear mirror 33 and the window 31a and enters the discharge space 35 as a seed beam.

In the discharge space 35, the power supply (not shown) causes discharge in synchronization with entry of the expanded pulse laser beam PT. The expanded pulse laser beam PT passes through the discharge space 35 excited by the discharge to cause stimulated emission, and the expanded pulse laser beam PT is amplified. The expanded pulse laser beam PT amplified is oscillated by the optical resonator and is output from the output coupling mirror 34.

As a result, from the laser system 2, the expanded pulse laser beam PT is output with a reduced peak power level and reduced coherence as compared with the pulse laser beam PL output from the solid-state laser apparatus 3.

1.3 Definition of Pulse Width

A pulse width TIS of the laser beam is defined by the following expression 1. Here, t is time. I(t) is optical intensity at the time t. The pulse width TIS of the expanded pulse laser beam PT is calculated by the following expression 1.

[Expression 1]

$$TIS = \frac{\left[\int I(t)dt\right]^2}{\int I(t)^2 dt} \quad (1)$$

1.4 Problem

Next, a problem of the laser system 2 according to the comparative example will be described. Since the laser beam supplied from the laser system 2 to an exposure apparatus preferably has lower coherence, a further reduction in coherence is desired.

1.4.1 Reduction in Coherence Due to Spatial Division

In the laser system 2 according to the comparative example, the OPS 10 temporally divides the pulse laser beam PL to reduce coherence. Further, spatially dividing the pulse laser beam PL can reduce coherence.

Figure 4:
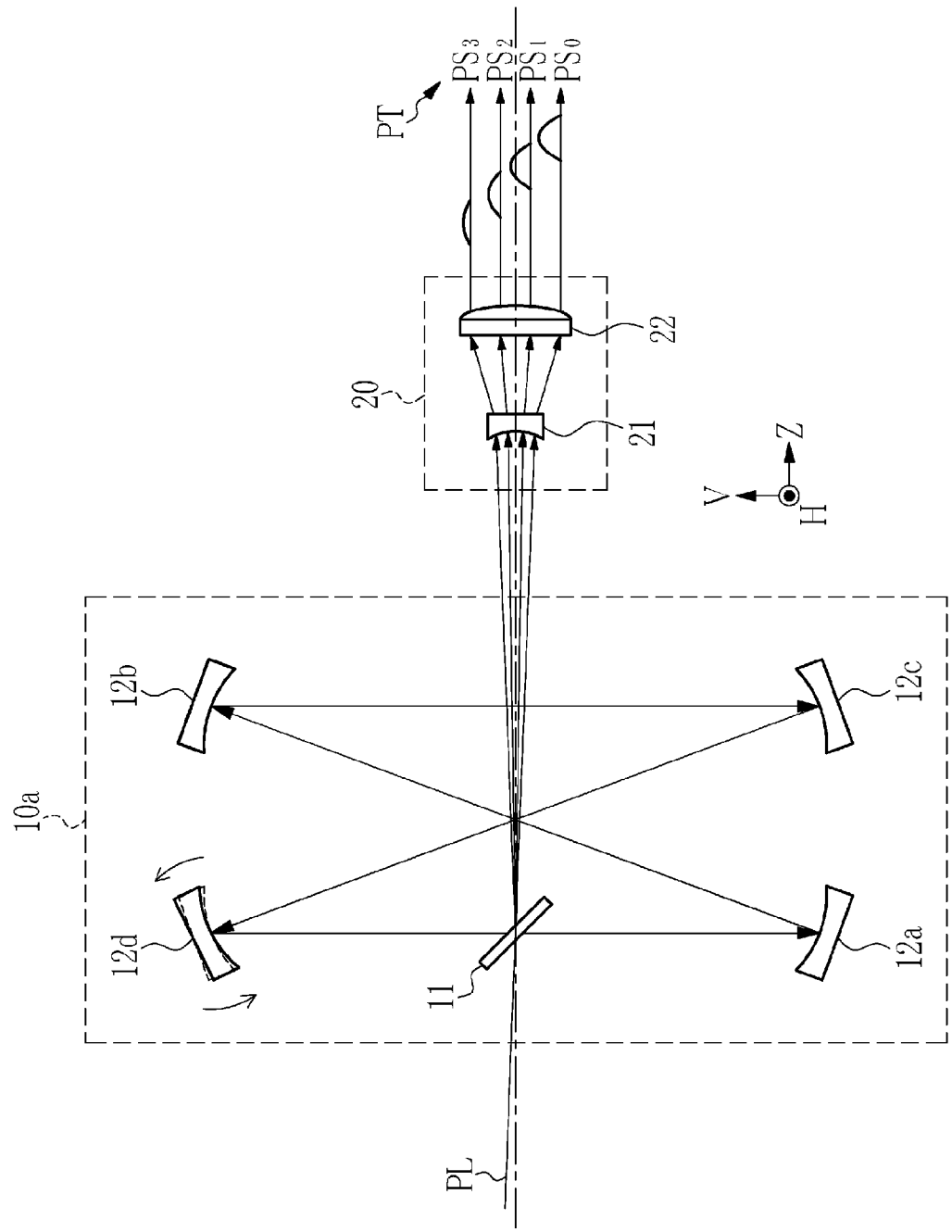
FIG. 4 shows a configuration of the OPS that temporally and spatially divides a pulse laser beam.

FIG. 4 shows a configuration of an OPS 10a that can temporally and spatially divide the pulse laser beam PL. The OPS 10a has the same configuration as the OPS 10 other than an arrangement of a fourth concave mirror 12d.

In FIG. 4, the fourth concave mirror 12d is arranged in a position slightly rotated around an axis in the H direction from the position of the fourth concave mirror 12d of the OPS 10 shown by the dashed line. With this configuration, a plurality of pulse beams $PS_n$ output from the OPS 10a have varying output angles in the V direction according to the number of times of circulation n through the delay optical path. Specifically, the plurality of pulse beams $PS_n$ output from the OPS 10a have different optical axes. As a result, the plurality of pulse beams $PS_n$ output from the OPS 10a are spatially divided in the V direction and enter the beam expander 20. In FIG. 4, a direction of the pulse laser beam PL entering the OPS 10a is slightly tilted from the Z direction.

Figure 5:
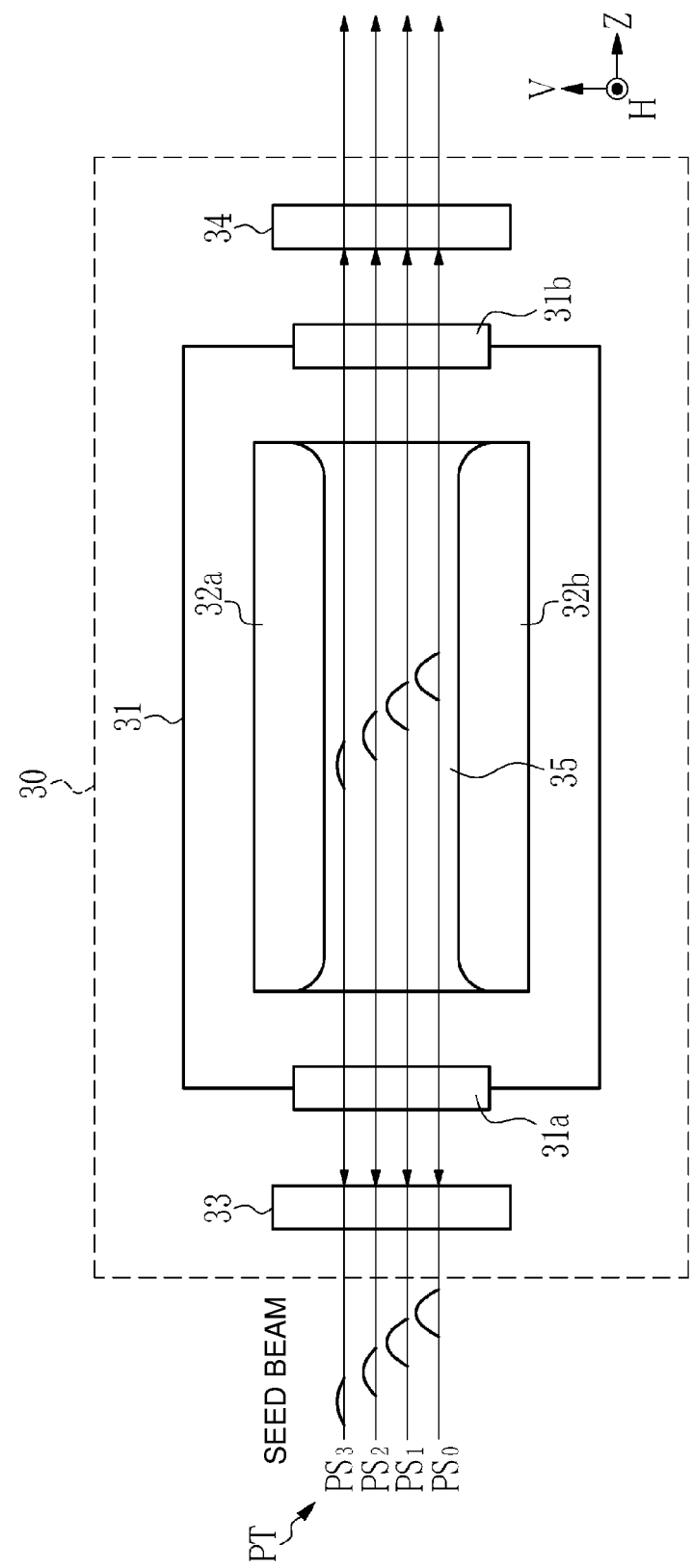
FIG. 5 illustrates an entering optical path of an expanded pulse laser beam into a discharge space.

FIG. 5 shows optical paths of the plurality of pulse beams $PS_n$ output from the beam expander 20 when entering the discharge space 35 in the amplifier 30 as seed beams. As such, the plurality of pulse beams $PS_n$ pass through different optical paths in the discharge space 35 according to the number of times of circulation n through the delay optical path. The OPS 10a generates the plurality of pulse beams $PS_n$ resulting from the pulse laser beam PL temporally and spatially divided, thereby further reducing coherence of the beam output from the amplifier 30.

However, if the pulse laser beam PL is temporally and spatially divided as described above, the discharge space 35 is not filled with the seed beams at the same time in the V direction. For example, the seed beam exists in a space that a zero-time circulation beam $PS_0$ enters in the discharge space 35 only at a time when the zero-time circulation beam $PS_0$ enters. Thus, at times when a one-time circulation beam $PS_1$ and thereafter enter, no seed beam exists on the optical path of the zero-time circulation beam $PS_0$.

The amplifier 30 is an excimer laser apparatus, and has such a short upper level lifetime of about 2 ns, the upper level lifetime being a lifetime of atoms excited at the upper level. Thus, if the discharge space 35 includes a space that is not filled with the seed beam, spontaneous emission may occur in the space before stimulated emission by the seed beam occurs. As a result, the beam output from the amplifier 30 may include much amplified spontaneous emission (ASE) beam as noise other than the amplified beam due to the stimulated emission.

Thus, with the OPS 10a configured as shown in FIG. 4, the beam output from the amplifier 30 has reduced coherence but has increased ASE beam. To prevent generation of the ASE beam, reflectivity of the optical resonator in the amplifier 30 may be increased so that more seed beams exist in the optical resonator. However, increasing the reflectivity of the optical resonator may increase energy in the optical resonator to damage an optical element.

Also, to prevent generation of the ASE beam, the pulse width of the expanded pulse laser beam PT may be increased. However, increasing the pulse width of the expanded pulse laser beam PT may reduce the optical intensity of the seed beam and increase components that do not contribute to amplification, thereby generating more ASE beam.

1.4.2 Reduction in Coherence Due to Random Phase Plate

Figure 6:
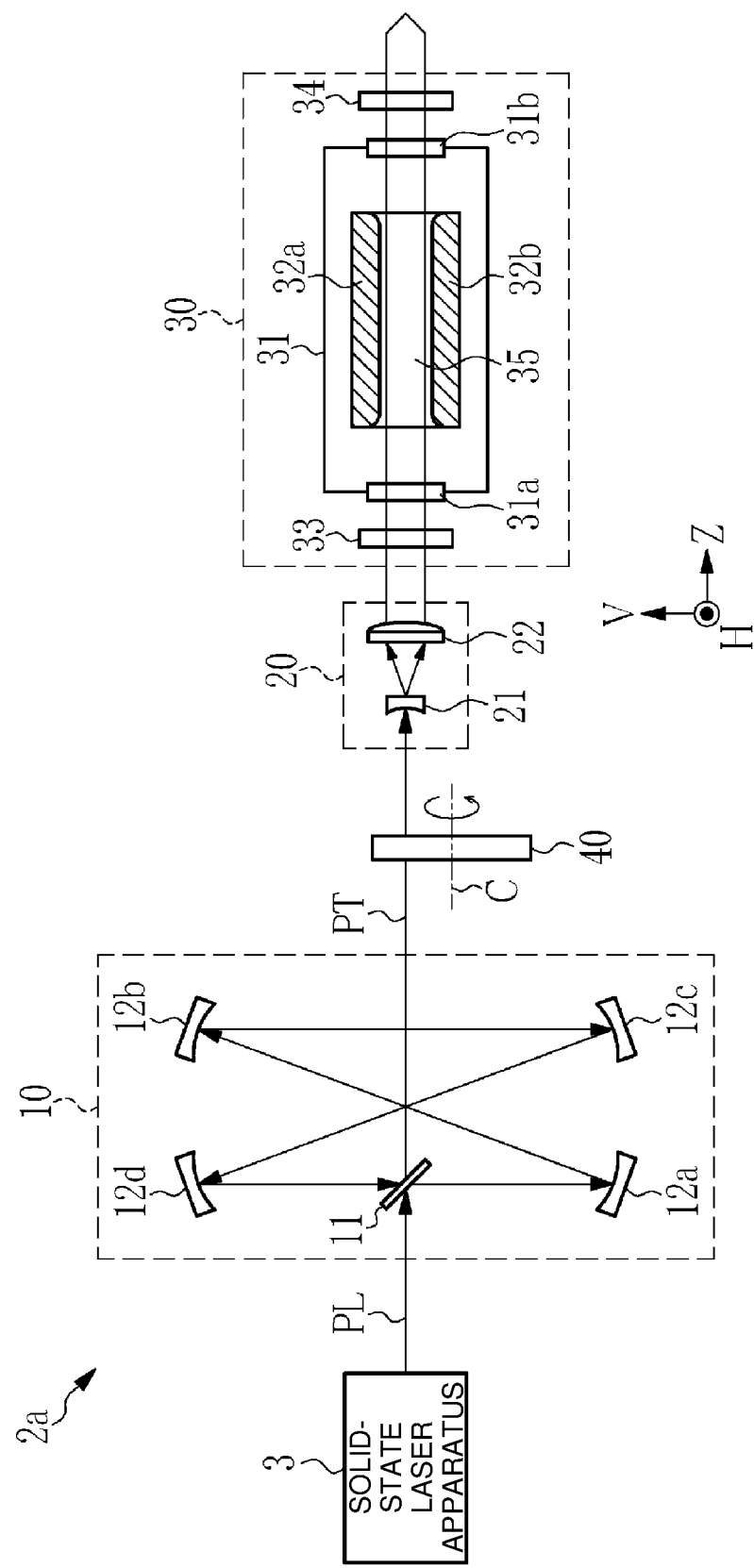
FIG. 6 illustrates a configuration of a laser system including a random phase plate arranged on an entry side of an amplifier.

Also, a random phase plate may be used to reduce coherence of the pulse laser beam PL. FIG. 6 shows a configuration of a laser system 2a with a random phase plate 40 arranged on an entry side of the amplifier 30. The laser system 2a has the same configuration as the laser system 2 according to the comparative example other than the random phase plate 40 being arranged between the OPS 10 and the beam expander 20.

The random phase plate 40 is rotated by a rotary mechanism (not shown) around an axis C passing through a center of the random phase plate 40 and perpendicular to the random phase plate 40. The axis C is parallel to the Z direction. The random phase plate 40 includes a plurality of types of cells for shifting a phase of the laser beam randomly arranged in two dimensions.

The expanded pulse laser beam PT emitted from the OPS 10 passes through the random phase plate 40 and is thus shifted in phase according to the passing cell, thereby reducing spatial coherence. However, the random phase plate 40 may generate speckles corresponding to phase shift distribution of the plurality of cells. Then, the random phase plate 40 may be rotated to change the phase shift distribution and change the speckles. For example, if the random phase plate 40 can be rotated for each pulse of the expanded pulse laser beam PT, the speckles differ for each pulse and speckle distribution is averaged. This can reduce substantial speckles in the expanded pulse laser beam PT.

However, even if the random phase plate 40 is rotated for each pulse, speckles may be generated in a beam profile of each pulse. Thus, to reduce the speckles of each pulse, the random phase plate 40 needs to be rotated greater than a size of one cell in a pulse width of one pulse.

However, the pulse width of the pulse laser beam PL is about 20 ns and the pulse width of the expanded pulse laser beam PT is about 200 ns, which are very short. Thus, it is difficult for the rotary mechanism to rotate the random phase plate 40 greater than the size of one cell in a pulse width of one pulse. Thus, an amount of change of an irradiation position of the random phase plate 40 with the expanded pulse laser beam PT is smaller than the size of one cell in the pulse width of one pulse, causing little change in the speckles. Specifically, even if the random phase plate 40 is rotated, the pulses enter the amplifier 30 with a speckle pattern generated by the random phase plate 40 being reflected as it is on the beam profile. As a result, the speckle pattern is maintained in the amplified laser beam.

Thus, rotating the random phase plate 40 for each pulse can reduce the speckles to some extent, but for a small number of exposure pulses on a wafer in the exposure apparatus, the speckles are not sufficiently reduced.

2. First Embodiment

Next, a laser system according to a first embodiment of the present disclosure will be described. The laser system according to the first embodiment has the same configuration as the laser system according to the comparative example in FIG. 1 other than a configuration of an OPS. Substantially the same components as those of the laser system according to the comparative example in FIG. 1 are denoted by the same reference numerals, and descriptions thereof are omitted as appropriate.

2.1 Configuration

Figure 7:
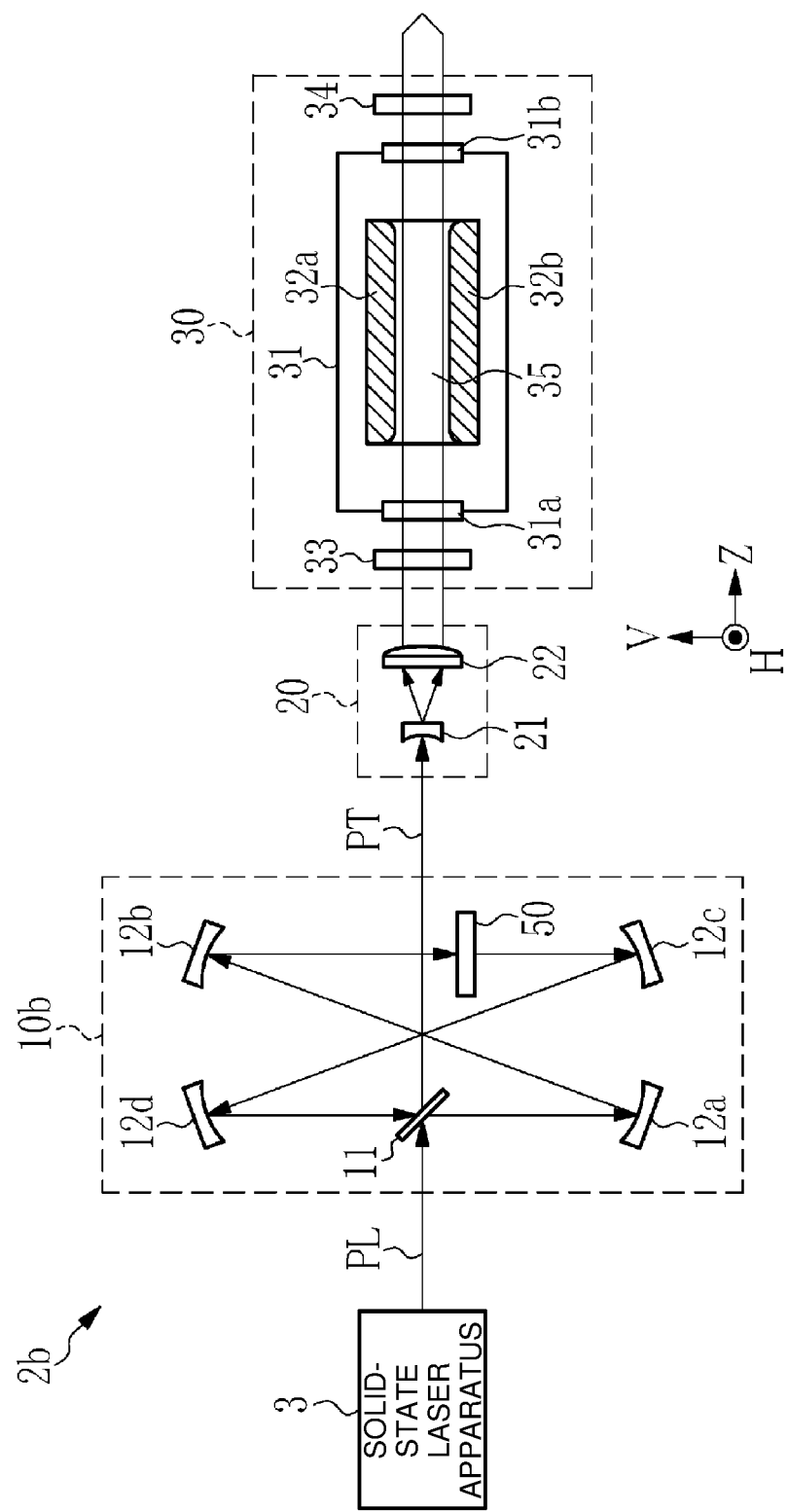
FIG. 7 shows a configuration of a laser system according to a first embodiment.

FIG. 7 shows a configuration of a laser system 2b according to the first embodiment. The laser system 2b includes a solid-state laser apparatus 3, an OPS 10b, a beam expander 20, and an amplifier 30. The OPS 10b includes a beam splitter 11, first to fourth concave mirrors 12a to 12d, and a random phase plate 50. The laser system 2b has the same configuration as the laser system 2 according to the comparative example other than the OPS 10b including the random phase plate 50.

The random phase plate 50 is a phase optical element, is a member separate from first to fourth concave mirrors 12a to 12d as optical elements that constitute the delay optical path, and is provided in a delay optical path. In this embodiment, the random phase plate 50 is fixedly arranged on the delay optical path between the second concave mirror 12b and the third concave mirror 12c. The optical elements that constitute the delay optical path mean optical elements for circulating a beam split by the beam splitter and having entered the delay optical path.

Figure 8:
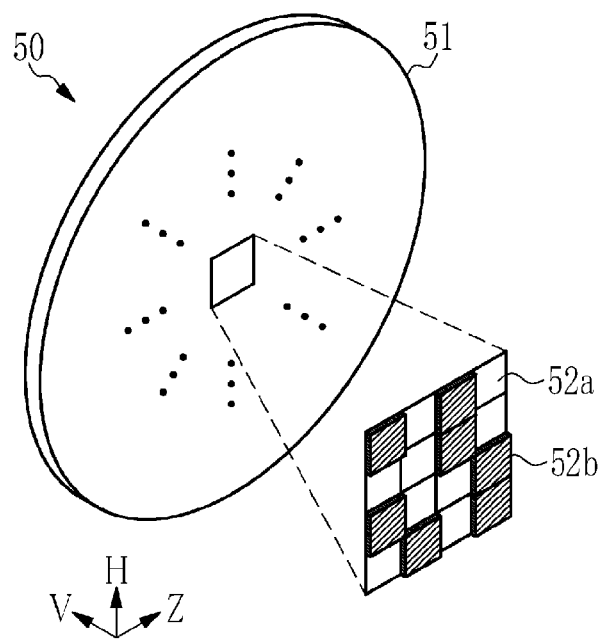
FIG. 8 is a perspective view of a configuration of a random phase plate.

FIG. 8 shows a configuration of the random phase plate 50. The random phase plate 50 includes a disc-like transparent substrate 51. On a surface of the transparent substrate 51, first cells 52a and second cells 52b providing different amounts of phase shift are randomly arranged in two dimensions. "Randomly" means that the first cells 52a and the second cells 52b are arranged irregularly in any directions in the surface of the transparent substrate 51. The first cell 52a and the second cell 52b each have a square shape.

Figure 9:
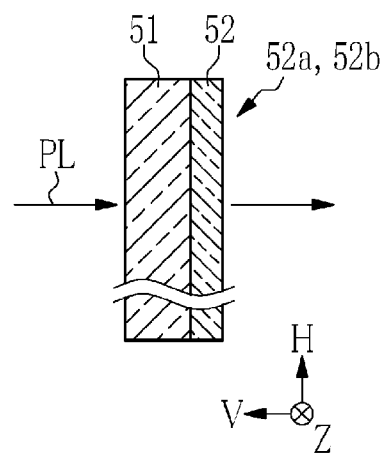
FIG. 9 is a sectional view of the configuration of the random phase plate.

As shown in FIG. 9, the first cell 52a and the second cell 52b are configured by forming, on the transparent substrate 51, a phase coat layer 52 having a predetermined thickness according to an amount of phase shift. The first cell 52a and the second cell 52b have the phase coat layers 52 of different thicknesses. There are at least two methods of forming, on the transparent substrate 51, a phase coat layer 52 having a predetermined thickness according to an amount of phase shift. The first method is to use a mask or the like to separately form films having different thicknesses on the transparent substrate 51 for the first cell 52a and the second cell 52b. The second method is to form a film having a certain thickness on the transparent substrate 51, and then cut the film by etching or the like so that the first cell 52a and the second cell 52b have predetermined thicknesses.

The transparent substrate 51 may be made of a material that highly transmits ultraviolet light, for example, calcium fluoride ($CaF_2$) crystal or synthetic silica glass. If a transmitted beam has a wavelength of about 193 nm, the transparent substrate 51 is preferably made of calcium fluoride crystal. The phase coat layer 52 is preferably made of fluoride, for example, calcium fluoride ($CaF_2$), magnesium fluoride ($MgF_2$), or gadolinium fluoride ($GdF_3$). The phase coat layer 52 may be made of silicon dioxide ($SiO_2$) if there is no problem in durability.

A difference in thickness of the phase coat layer 52 between the first cell 52a and the second cell 52b causes a phase difference $k\pi$ between a beam passing through the first cell 52a and a beam passing through the second cell 52b. k is any of 1, 2, 3, . . . The thickness of the phase coat layer 52 is set based on a refractive index of the phase coat layer 52, a wavelength of the transmitted beam, and a desired phase difference. The first cell 52a may have no phase coat layer 52 and provide an approximately zero amount of phase shift to the pulse laser beam PL. In this case, the thickness of the phase coat layer 52 may be set so that the amount of phase shift provided to the pulse laser beam PL by the second cell 52b is approximately $\pi$.

When an area of the first cell 52a is A1 and an area of the second cell 52b is A2 on the transparent substrate 51, an area ratio A1/A2 is preferably in the range of 0.1 to 10. The area ratio A1/A2 is more preferably approximately 1.

The areas of the first cell 52a and the second cell 52b are preferably determined according to a diameter of the pulse laser beam PL entering the random phase plate 50. For example, the areas of the first cell 52a and the second cell 52b are preferably determined so that the total number of the first cells 52a and the second cells 52b that the pulse laser beam PL enters is about 10 to 10000. The diameter of the pulse laser beam PL is about 1 mm.

An upper limit of each side of the first cell 52a and the second cell 52b is preferably 200 μm. A lower limit of each side of the first cell 52a and the second cell 52b is preferably 10 μm since too small a size causes diffraction. Specifically, each side of the first cell 52a and the second cell 52b is preferably in the range of 10 μm to 200 μm. The shape of the first cell 52a and the second cell 52b is not limited to the square, but may be a polygon such as a regular triangle or a regular hexagon. The first cell 52a and the second cell 52b may have any shape other than the polygon. Further, the first cell 52a and the second cell 52b may have different shapes or sizes.

With the above configuration, the random phase plate 50 has a function of spatially and randomly shifting a phase of a laser beam. This function is hereinafter referred to as a spatial random phase shift function.

To prevent an ASE beam from the amplifier 30, a pulse width TIS of an expanded pulse laser beam PT preferably satisfies the following expression 2 when an optical path length of an optical resonator in the amplifier 30 is $L_{amp}$. The optical path length $L_{amp}$ of the optical resonator is twice a resonator length $L_a$ that is a distance between a rear mirror 33 and an output coupling mirror 34. Specifically, $L_{amp}=2L_a$ is satisfied.

$$TIS \geq L_{amp}/c \quad (2)$$

2.2 Operation

Next, an operation of the laser system 2b according to the first embodiment will be described. First, the pulse laser beam PL output from the solid-state laser apparatus 3 enters the beam splitter 11 in the OPS 10b. One part of the pulse laser beam PL having entered the beam splitter 11 passes through the beam splitter 11 and is output from the OPS 10b as a zero-time circulation beam $PS_0$ that has not circulated through the delay optical path.

The other part of the pulse laser beam PL having entered the beam splitter 11 is reflected by the beam splitter 11, enters the delay optical path, is highly reflected by the first concave mirror 12a and the second concave mirror 12b, and enters the random phase plate 50. The pulse laser beam PL having entered the random phase plate 50 passes through the random phase plate 50 and is spatially and randomly shifted in phase. The pulse laser beam PL having passed through the random phase plate 50 is highly reflected by the third concave mirror 12c and the fourth concave mirror 12d and again enters the beam splitter 11.

One part of the beam having entered the beam splitter 11 from the fourth concave mirror 12d is reflected by the beam splitter 11, and output from the OPS 10b as a one-time circulation beam $PS_1$ having once circulated through the delay optical path. The other part of the beam having entered the beam splitter 11 from the fourth concave mirror 12d passes through the beam splitter 11, again enters the delay optical path, is highly reflected the first concave mirror 12a and the second concave mirror 12b, and enters the random phase plate 50. The pulse laser beam PL having entered the random phase plate 50 passes through the random phase plate 50 and is further spatially and randomly shifted in phase. The pulse laser beam PL having passed through the random phase plate 50 is highly reflected by the third concave mirror 12c and the fourth concave mirror 12d and again enters the beam splitter 11.

One part of the beam having entered the beam splitter 11 from the fourth concave mirror 12d is reflected by the beam splitter 11 and output from the OPS 10b as a two-times circulation beam $PS_2$ having twice circulated through the delay optical path. Then, the circulation of the beam through the delay optical path is repeated, and thus pulse beams such as a three-times circulation beam $PS_3$, a four-times circulation beam $PS_4$, . . . are output in order from the OPS 10b. An n-times circulation beam $PS_n$ is a pulse beam that has passed through the random phase plate 50 n times. The pulse beams output from the OPS 10b have substantially the same optical axis.

However, it is actually difficult to fabricate the OPS 10b so that the circulation beams have completely the same optical axis, and there is some deviation between the optical axes of the circulation beams. An amount of deviation between the optical axes is generally larger than the size of the first cell 52a and the second cell 52b of the random phase plate 50. Speckles corresponding to phase shift distribution of the random phase plate 50 are generated in the circulation beam through the delay optical path, but the deviation between the optical axes causes changes in distribution of the generated speckles every time the circulation beam passes through the random phase plate 50. Thus, the speckle distribution in the circulation beam is more averaged as the number of times of circulation n increases.

The pulse beams $PS_0$, $PS_1$, $PS_2$, . . . output from the OPS 10b have different numbers of times of circulation n, and thus are different in speckle distribution. In the expanded pulse laser beam PT that is a combination of these pulse beams, the pulse beams are different in speckle distribution, thereby reducing substantial speckles.

The expanded pulse laser beam PT output from the OPS 10b enters the beam expander 20 and is output with its diameter expanded by the beam expander 20. The expanded pulse laser beam PT output from the beam expander 20 enters the amplifier 30. The expanded pulse laser beam PT having entered the amplifier 30 passes through the rear mirror 33 and a window 31a, enters a discharge space 35 as a seed beam, and is amplified by discharge that occurs in the discharge space 35.

The pulse beams included in the expanded pulse laser beam PT entering the amplifier 30 have substantially the same optical axis, and are thus superimposed in the discharge space 35. As expressed by the equation 2, the pulse width TIS of the expanded pulse laser beam PT is larger than the optical path length $L_{amp}$ of the optical resonator, and thus the seed beam fills the discharge space 35 at any time during the discharge of the amplifier 30.

The expanded pulse laser beam PT amplified by the amplifier 30 is oscillated by the optical resonator and output from the output coupling mirror 34. Other operations and functions are similar to those of the comparative example.

2.3 Effect

In the first embodiment, the random phase plate 50 is arranged on the delay optical path included in the OPS 10b. Thus, the circulation beam circulating through the delay optical path is spatially and randomly shifted in phase every time it passes through the random phase plate 50, thereby reducing coherence. The circulation beam is changed in speckle distribution every time it passes through the random phase plate 50, and thus substantial speckles in the expanded pulse laser beam PT output from the OPS 10b are reduced. Therefore, according to the first embodiment, the speckles can be reduced without rotating the random phase plate 50. In the first embodiment, there is an advantage since there is no need for a rotary mechanism for the random phase plate 50, thereby facilitating manufacture of the laser system 2b as compared with the configuration in FIG. 6.

In the first embodiment, the pulse beams included in the expanded pulse laser beam PT entering the amplifier 30 have substantially the same optical axis, and spatially fill the discharge space 35. This prevents the ASE beam as compared with the configuration in FIGS. 4 and 5. Further, the pulse width TIS of the expanded pulse laser beam PT is larger than the optical path length $L_{amp}$ of the optical resonator, and the seed beam fills the discharge space 35 at any time during the discharge of the amplifier 30, thereby further preventing the ASE beam.

2.4 Variant

Now, a variant of the laser system 2b according to the first embodiment will be described. In the first embodiment, the random phase plate 50 is arranged on the delay optical path between the second concave mirror 12b and the third concave mirror 12c. The random phase plate 50 may be arranged in any position on the delay optical path, not limited to between the second concave mirror 12b and the third concave mirror 12c.

The random phase plate 50 is preferably arranged between the second concave mirror 12b and the third concave mirror 12c because the circulation beam is a collimated beam and has a large diameter between the second concave mirror 12b and the third concave mirror 12c as shown in FIG. 2. The random phase plate 50 is also preferably arranged on the delay optical path between the beam splitter 11 and the first concave mirror 12a or between the fourth concave mirror 12d and the beam splitter 11 where the circulation beam is the collimated beam. That is, the random phase plate 50 is preferably arranged on the optical path of the collimated beam collimated in the delay optical path.

In the first embodiment, the beam expander 20 is arranged between the OPS 10b and the amplifier 30. However, the beam expander 20 needs not be arranged if the seed beam can fill the discharge space 35 without the beam expander 20.

In the first embodiment, the random phase plate 50 is configured by forming the phase coat layer 52 on the transparent substrate 51. An anti-reflective (AR) coat layer may be further formed on the transparent substrate 51. Providing the AR coat layer reduces light amount loss.

Figure 10:
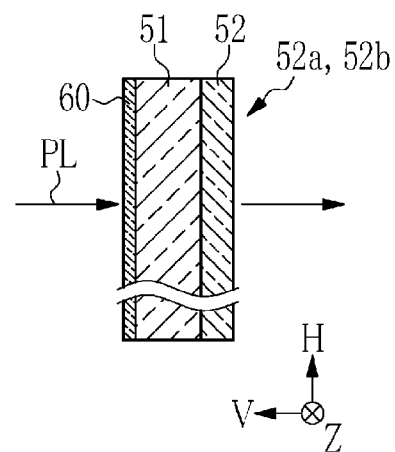
FIG. 10 is a sectional view of a configuration according to a first variant of the random phase plate.

FIG. 10 shows an example in which an AR coat layer 60 is formed on one surface of the transparent substrate 51. The AR coat layer 60 is formed on a surface opposite to a surface of the transparent substrate 51 on which the phase coat layer 52 is formed. A thickness of the AR coat layer 60 is $\lambda/4$. The AR coat layer 60 is preferably made of magnesium fluoride ($MgF_2$) and a single layer.

Figure 11:
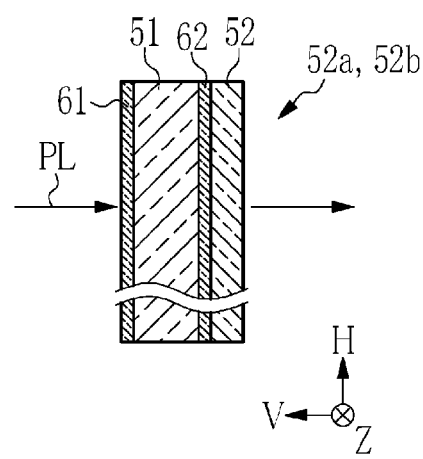
FIG. 11 is a sectional view of a configuration according to a second variant of the random phase plate.

FIG. 11 shows an example in which a first AR coat layer 61 is formed on one surface of the transparent substrate 51 and a second AR coat layer 62 is formed on the other surface. The first AR coat layer 61 is formed on a surface opposite to a surface of the transparent substrate 51 on which the phase coat layer 52 is formed. The second AR coat layer 62 is formed on the surface of the transparent substrate 51 on which the phase coat layer 52 is formed. A thickness of each of the first AR coat layer 61 and the second AR coat layer 62 is $\lambda/4$. The first AR coat layer 61 and the second AR coat layer 62 are preferably made of $MgF_2$ and single layers.

In the first embodiment, the random phase plate 50 includes two types of cells: the first cell 52a and the second cell 52b as the cells providing the phase shift to the transmitted beam, but not limited to this, the random phase plate 50 may include three or more types of cells providing different amounts of phase shift. When the random phase plate includes the three or more types of cells, an amount of phase shift of each cell is preferably set to 0 to $\lambda$, but the amount of phase shift may be $\pi$ or more.

3. Second Embodiment

Next, a laser system according to a second embodiment of the present disclosure will be described. In the first embodiment, as the phase optical element having the spatial random phase shift function, the random phase plate is a member separate from the optical elements that constitute the OPS and is provided separately. In the second embodiment, a concave mirror as an optical element that constitutes an OPS has a spatial random phase shift function.

3.1 Configuration

Figure 12:
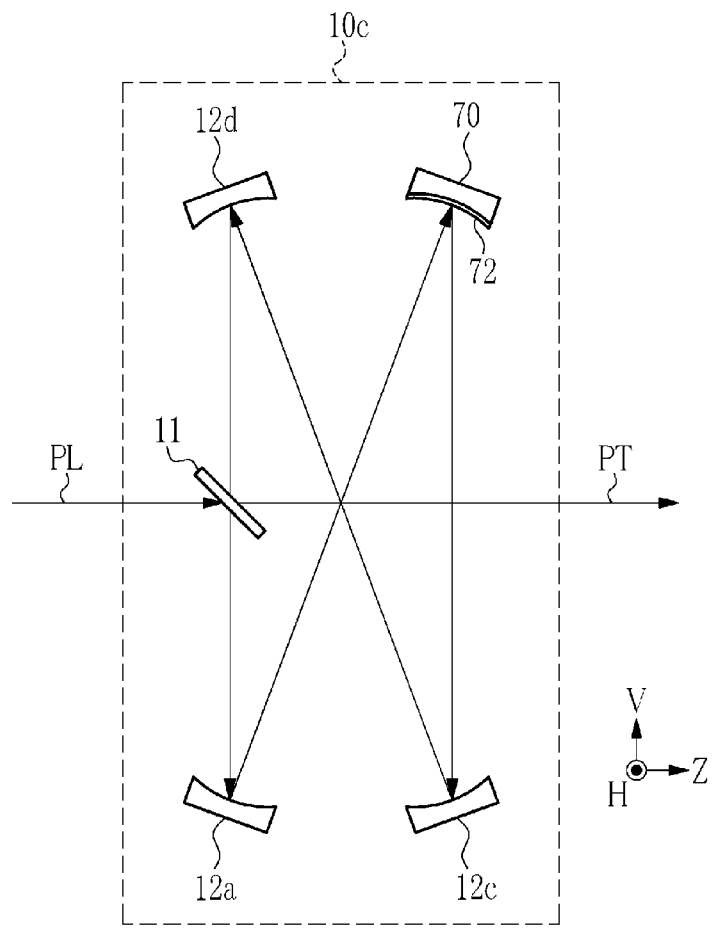
FIG. 12 shows a configuration of an OPS used in a laser system according to a second embodiment.

FIG. 12 shows a configuration of an OPS 10c used in the laser system according to the second embodiment. The laser system according to the second embodiment has the same configuration as the laser system 2b according to the first embodiment other than using the OPS 10c instead of the OPS 10b.

Figure 13:
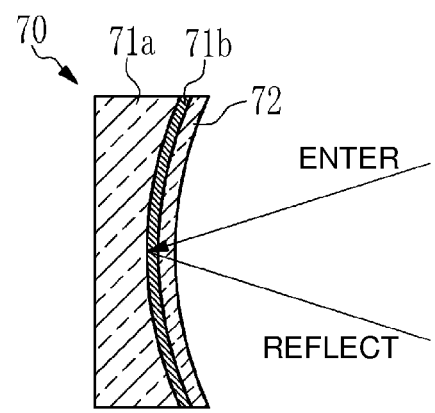
FIG. 13 is a sectional view of a configuration of a concave mirror having a spatial random phase shift function.

The OPS 10c is different from the OPS 10 according to the comparative example only in that a second concave mirror 70 having a spatial random phase shift function is used instead of the second concave mirror 12b. As shown in FIG. 13, the second concave mirror 70 includes a substrate 71a, a high reflection film 71b, and a phase coat layer 72. The substrate 71a is made of, for example, $CaF_2$ and has a concave surface.

The high reflection film 71b is formed on the concave surface of the substrate 71a. The high reflection film 71b is, for example, a dielectric multilayer film having a thickness of several micrometers. As the dielectric multilayer film, a dielectric multilayer film of an aluminium oxide ($Al_2O_3$) film and a silicon dioxide ($SiO_2$) film alternately laminated, or a dielectric multilayer film of a magnesium fluoride ($MgF_2$) film and a gadolinium fluoride ($GdF_3$) film alternately laminated is used.

The phase coat layer 72 is formed on a surface of the high reflection film 71b. A material for the phase coat layer 72 is similar to that for the phase coat layer 52 according to the first embodiment.

Similarly to the phase coat layer 52 according to the first embodiment, the phase coat layer 72 configures a plurality of cells providing different amounts of phase shift according to setting of a thickness. Thus, the second concave mirror 70 also serves as a phase optical element having a spatial random phase shift function. Since a beam entering the second concave mirror 70 passes through the phase coat layer 72 twice in one reflection by the high reflection film 71b, the thickness of the phase coat layer 72 may be half of the thickness of the phase coat layer 52 for the same amount of phase shift.

3.2 Operation

Next, an operation of the laser system according to the second embodiment will be described. The operation of the laser system according to the second embodiment is different from that of the laser system 2b according to the first embodiment only in that the pulse laser beam PL is spatially and randomly shifted in phase by the second concave mirror 70.

A circulation beam circulating through a delay optical path of the OPS 10c enters the second concave mirror 70, passes through the phase coat layer 72, is highly reflected by the high reflection film 71b, and then again passes through the phase coat layer 72. The circulation beam passes through the phase coat layer 72 and is spatially and randomly shifted in phase. The circulation beam is spatially and randomly shifted in phase every time it enters the second concave mirror 70 and is highly reflected.

3.3 Effect

In the second embodiment, the second concave mirror 12b has the function of the concave mirror and the spatial random phase shift function, thereby reducing the number of optical elements included in the OPS as compared with the first embodiment.

3.4 Variant

Now, a variant of the laser system according to the second embodiment will be described. In the second embodiment, among the first to fourth concave mirrors that constitute the delay optical path, the second concave mirror has the spatial random phase shift function, but any of the concave mirrors may have the spatial random phase shift function. A plurality of concave mirrors may have the spatial random phase shift function.

Figure 14:
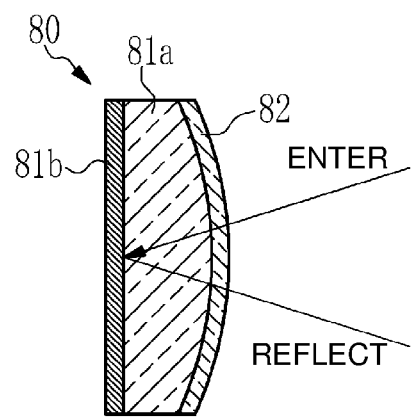
FIG. 14 is a sectional view of a configuration according to a first variant of the concave mirror.

Next, a variant of the concave mirror having the spatial random phase shift function will be described. FIG. 14 shows a high reflection mirror 80 having the spatial random phase shift function and optically equivalent to the concave mirror. The high reflection mirror 80 includes a planoconvex substrate 81a, a high reflection film 81b, and a phase coat layer 82. The high reflection film 81b is formed on a plane surface of the substrate 81a. The substrate 81a on which the high reflection film 81b is formed has an optical property equivalent to that of the concave mirror. The high reflection film 81b is formed of a dielectric multilayer film similar to the high reflection film 71b. The substrate 81a is made of, for example, $CaF_2$.

The phase coat layer 82 is formed on a convex surface of the substrate 81a. Similarly to the phase coat layer 72, the phase coat layer 82 configures a plurality of cells providing different amounts of phase shift according to setting of a thickness. Thus, the high reflection mirror 80 also serves as a phase optical element having a spatial random phase shift function. The high reflection mirror 80 may be applied to any of the first to fourth concave mirrors that constitute the delay optical path.

Figure 15:
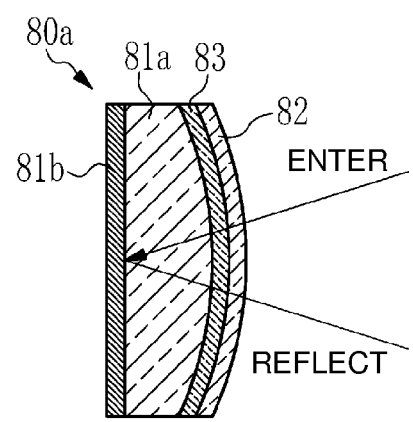
FIG. 15 is a sectional view of a configuration according to a second variant of the concave mirror.

Also, as in a high reflection mirror 80a in FIG. 15, an AR coat layer 83 may be formed on the convex surface of the substrate 81a, and the phase coat layer 82 may be formed on a surface of the AR coat layer 83. The AR coat layer 83 has a configuration similar to that of the AR coat layer 60 described above. The high reflection mirror 80a including the AR coat layer 83 further reduces light amount loss as compared with the high reflection mirror 80.

For the high reflection mirrors 80, 80a in FIGS. 14 and 15, the circulation beam circulating through the delay optical path may pass through the phase coat layer 82 at deviated positions when entering the high reflection mirrors 80, 80a and when being reflected by the high reflection mirrors 80, 80a, thereby causing deviation of speckle distribution. This advantageously further reduces speckles.

Comparing the mirrors 70, 80, 80a in FIGS. 13 to 15, the mirror 70 in FIG. 13 is the most resistant to the pulse laser beam PL.

4. Third Embodiment

Next, a laser system according to a third embodiment of the present disclosure will be described. In the second embodiment, the concave mirror as the optical element included in the OPS has the spatial random phase shift function. In the third embodiment, a beam splitter as one of optical elements included in an OPS has a spatial random phase shift function.

4.1 Configuration

Figure 16:
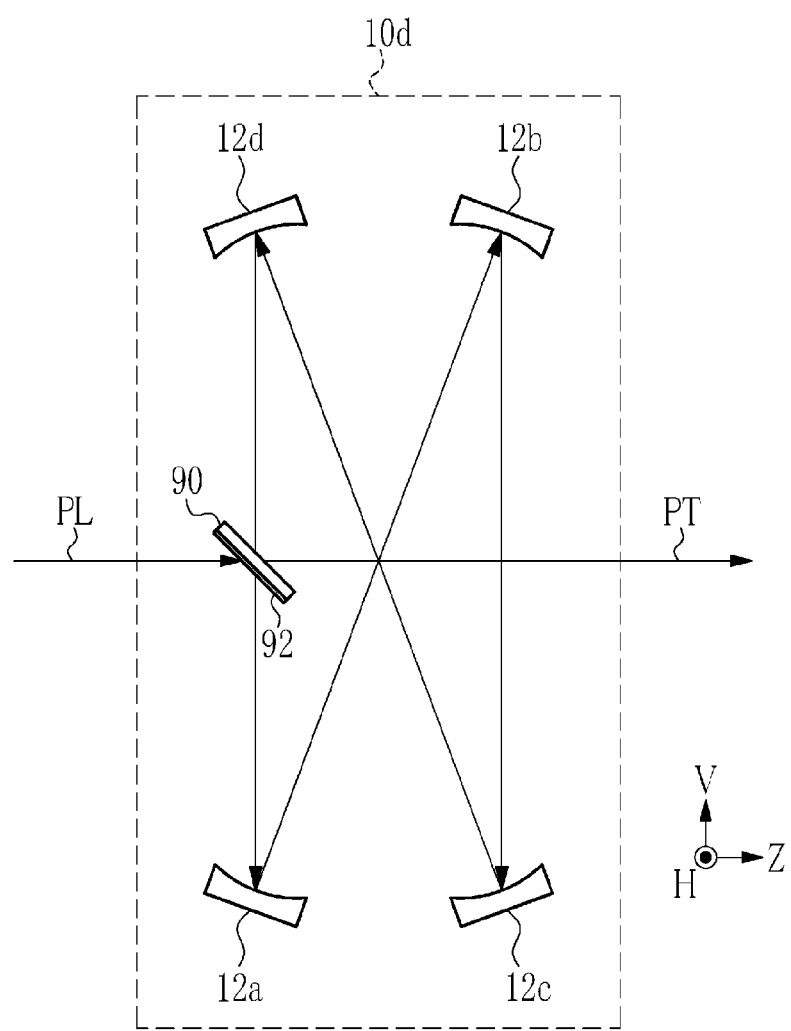
FIG. 16 shows a configuration of an OPS used in a laser system according to a third embodiment.

FIG. 16 shows a configuration of an OPS 10d used in the laser system according to the third embodiment. The laser system according to the third embodiment has the same configuration as the laser system 2b according to the first embodiment other than using the OPS 10d instead of the OPS 10b.

Figure 17:
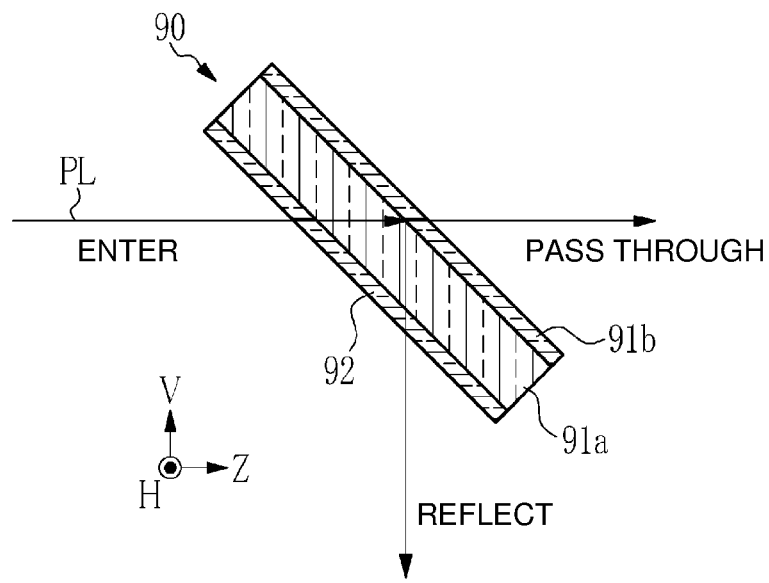
FIG. 17 is a sectional view of a configuration of a beam splitter having a spatial random phase shift function.

The OPS 10d is different from the OPS 10 according to the comparative example only in that a beam splitter 90 having a spatial random phase shift function is used instead of the beam splitter 11. As shown in FIG. 17, the beam splitter 90 includes a substrate 91a, a partial reflection film 91b, and a phase coat layer 92. The substrate 91a is a parallel plane substrate and made of $CaF_2$ crystal or synthetic silica glass. The partial reflection film 91b is formed on one surface of the substrate 91a, and the phase coat layer 92 is formed on the other surface.

The partial reflection film 91b is formed on a surface of the substrate 91a opposite to a surface that a pulse laser beam PL enters from a solid-state laser apparatus 3. The partial reflection film 91b is a dielectric multilayer film, and the number of films is set so that reflectivity is about 60%. As the dielectric multilayer film, a dielectric multilayer film of an $Al_2O_3$ film and an $SiO_2$ film alternately laminated, or a dielectric multilayer film of an $MgF_2$ film and a $GdF_3$ film alternately laminated is used.

The phase coat layer 92 is formed on the surface of the substrate 91a that the pulse laser beam PL enters from the solid-state laser apparatus 3. A material for the phase coat layer 92 is similar to that for the phase coat layer 52 according to the first embodiment.

Similarly to the phase coat layer 52 according to the first embodiment, the phase coat layer 92 configures a plurality of cells providing different amounts of phase shift according to setting of a thickness. Thus, the beam splitter 90 also serves as a phase optical element having a spatial random phase shift function.

4.2 Operation

Next, an operation of the laser system according to the third embodiment will be described. The operation of the laser system according the third embodiment is different from that of the laser system 2b according to the first embodiment only in that the pulse laser beam PL is spatially and randomly shifted in phase by the beam splitter 90.

First, the pulse laser beam PL output from a solid-state laser apparatus 3 enters the beam splitter 90 in the OPS 10d. The pulse laser beam PL having entered the beam splitter 90 passes through the phase coat layer 92 and the substrate 91a, and enters the partial reflection film 91b. One part of the pulse laser beam PL having entered the partial reflection film 91b passes through the partial reflection film 91b and is output from the OPS 10d as a zero-time circulation beam $PS_0$. In this embodiment, the zero-time circulation beam $PS_0$ passes through the phase coat layer 92 and is thus spatially and randomly shifted in phase.

The other part of the pulse laser beam PL having entered the partial reflection film 91b is reflected by the partial reflection film 91b, passes through the substrate 91a and the phase coat layer 92, is output, and enters a delay optical path constituted by first to fourth concave mirrors 12a to 12d. The beam having circulated through the delay optical path again enters the beam splitter 90 from the fourth concave mirror 12d. One part of the beam having entered the beam splitter 90 is reflected by the partial reflection film 91b and output from the OPS 10d as a one-time circulation beam $PS_1$.

The beam having passed through the partial reflection film 91b again passes through the phase coat layer 92 and circulates through the delay optical path. The circulation beam through the delay optical path is spatially and randomly shifted in phase every time it passes through the beam splitter 90.

4.3 Effect

In the third embodiment, the beam splitter 90 has the beam splitting function and the spatial random phase shift function, thereby reducing the number of optical elements included in the OPS as compared with the first embodiment.

In the third embodiment, the zero-time circulation beam $PS_0$ is also spatially and randomly shifted in phase, thereby further reducing coherence of an expanded pulse laser beam PT output from the OPS and reducing substantial speckles as compared with the first and second embodiments.

4.4 Variant

In the third embodiment, the beam splitter 90 is configured by forming the partial reflection film 91b on one surface of the substrate 91a and forming the phase coat layer 92 on the other surface. Further, an AR coat layer may be formed on the substrate 91a. In a beam splitter 90a in FIG. 18, an AR coat layer 93 is formed on a surface of the substrate 91a opposite to a surface on which the partial reflection film 91b is formed. The phase coat layer 92 is formed on a surface of the AR coat layer 93. The AR coat layer 93 has a configuration similar to that of the AR coat layer 60 described above.

Figure 19:
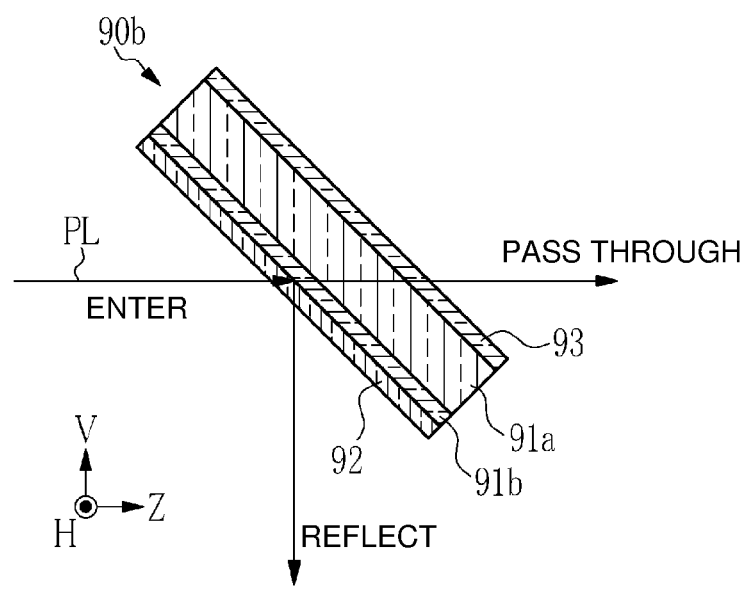
FIG. 19 is a sectional view of a configuration according to a second variant of the beam splitter.

In a beam splitter 90b in FIG. 19, the partial reflection film 91b is formed on the surface of the substrate 91a that the pulse laser beam PL enters from the solid-state laser apparatus 3, and the AR coat layer 93 is formed on the surface opposite to the partial reflection film 91b. The phase coat layer 92 is formed on a surface of the partial reflection film 91b.

The beam splitters 90a, 90b include the AR coat layer 93, thereby reducing light amount loss as compared with the beam splitter 90.

In the third embodiment and the variant, the phase coat layer 92 is provided on the surface of the substrate 91a that the pulse laser beam PL enters from the solid-state laser apparatus 3, but may be provided on a side opposite to the entry side. Further, the partial reflection film 91b may be provided on either surface of the substrate 91a.

Figure 18:
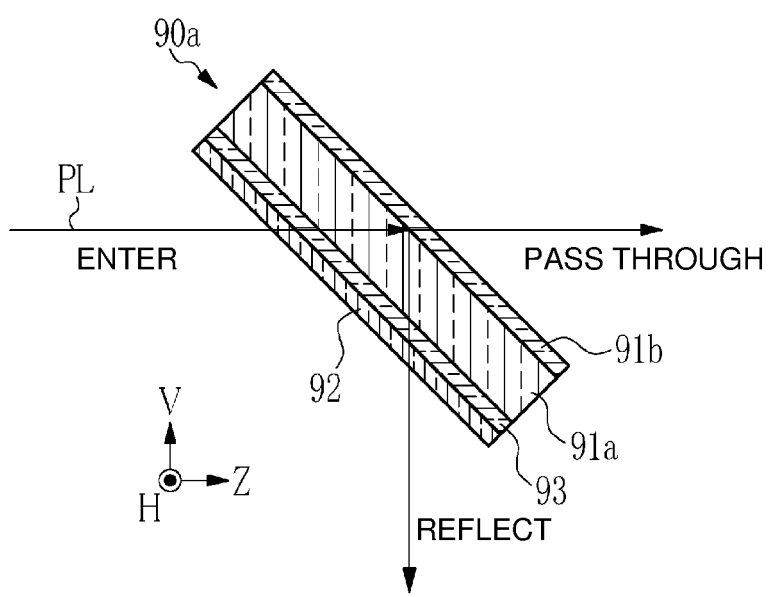
FIG. 18 is a sectional view of a configuration according to a first variant of the beam splitter.

Comparing the beam splitters 90, 90a, 90b in FIGS. 17 to 19, the beam splitter 90b in FIG. 19 is the most resistant to the pulse laser beam PL.

5. Fourth Embodiment

Next, a laser system according to a fourth embodiment of the present disclosure will be described. In the first to third embodiments, the phase optical element is provided in the delay optical path included in the OPS. In the fourth embodiment, a random phase plate as a phase optical element is provided in an optical path of an optical resonator included in an amplifier.

5.1 Configuration

Figure 20:
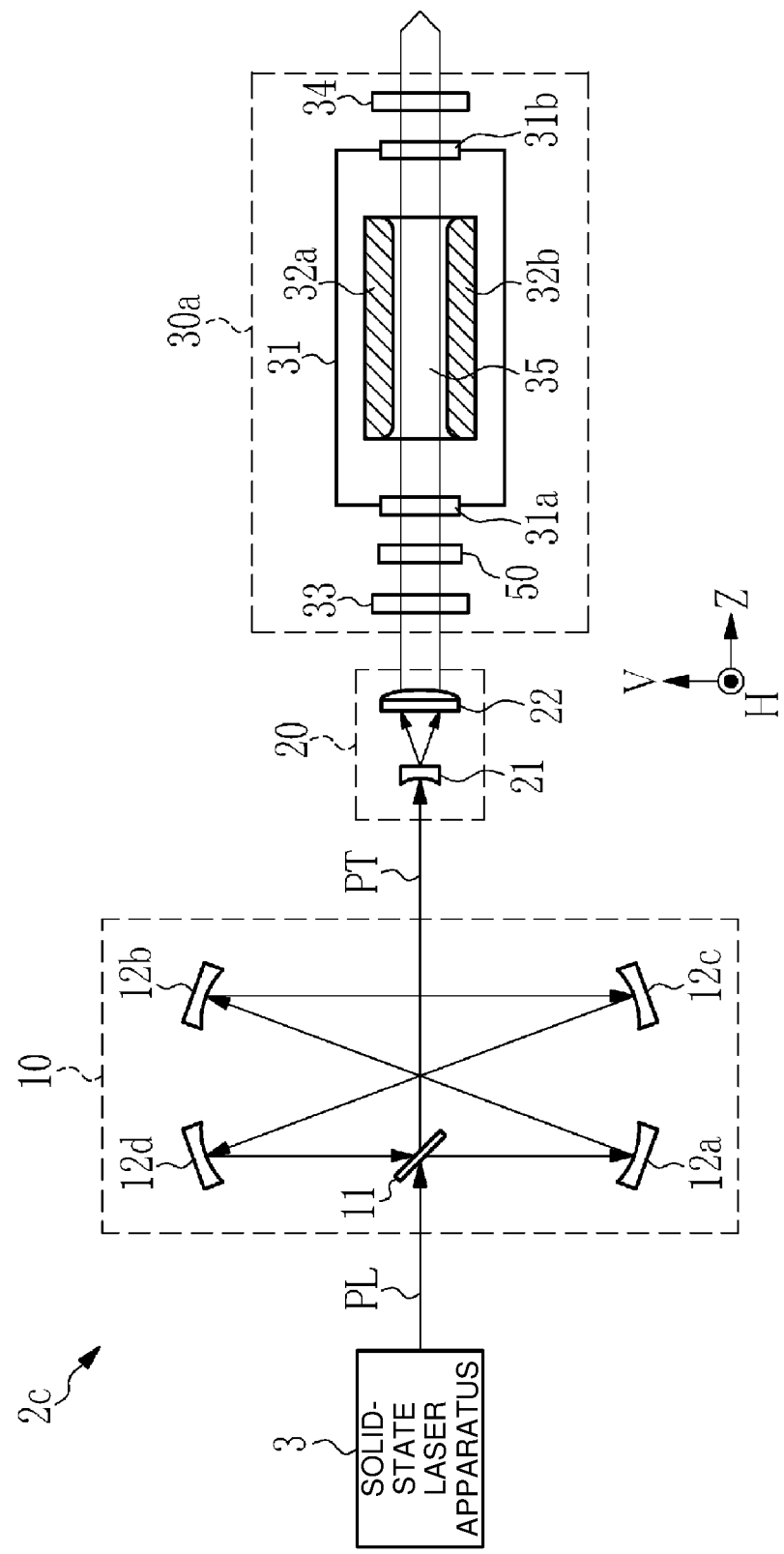
FIG. 20 shows a configuration of a laser system according to a fourth embodiment.

FIG. 20 shows a configuration of a laser system 2c according to the fourth embodiment. The laser system 2c includes a solid-state laser apparatus 3, an OPS 10, a beam expander 20, and an amplifier 30a. The laser system 2c has the same configuration as the laser system 2 according to the comparative example other than a configuration of the amplifier 30a.

The amplifier 30a includes a random phase plate 50 having a configuration similar to that in the first embodiment in an optical path of an optical resonator. The random phase plate 50 is a member separate from a rear mirror 33, an output coupling mirror 34, and windows 31a, 31b as optical elements that constitute the amplifier 30a. The random phase plate 50 is separately provided in an optical path of a Fabry-Perot resonator constituted by the rear mirror 33 and the output coupling mirror 34. Specifically, the random phase plate 50 is arranged on the optical path between the rear mirror 33 and the laser chamber 31. The optical elements that constitute the amplifier refer to optical elements included in a laser chamber and the optical resonator.

5.2 Operation

Next, an operation of the laser system 2c according to the fourth embodiment will be described. An expanded pulse laser beam PT output from the OPS 10 is expanded in diameter by the beam expander 20 and enters the amplifier 30a as a seed beam. The expanded pulse laser beam PT having entered the amplifier 30a passes through the rear mirror 33 and enters the random phase plate 50. The expanded pulse laser beam PT passes through the random phase plate 50 and is thus spatially and randomly shifted in phase. The expanded pulse laser beam PT having passed through the random phase plate 50 passes through the window 31a and through a discharge space 35 and is thus amplified.

The expanded pulse laser beam PT amplified passes through the window 31b and enters the output coupling mirror 34. One part of the expanded pulse laser beam PT having entered the output coupling mirror 34 passes through the output coupling mirror 34 and is output to an exposure apparatus. The other part of the expanded pulse laser beam PT having entered the output coupling mirror 34 is reflected by the output coupling mirror 34, passes through the window 31b and again through the discharge space 35, and is thus amplified.

The expanded pulse laser beam PT amplified passes through the window 31a and again through the random phase plate 50 and is thus further spatially and randomly shifted in phase. The expanded pulse laser beam PT having passed through the random phase plate 50 is reflected by the rear mirror 33, passes through the random phase plate 50, and is thus further spatially and randomly shifted in phase.

The above operation is repeated to amplify and oscillate the beam, and a plurality of amplified pulse laser beams are output from the output coupling mirror 34 and enter the exposure apparatus.

5.3 Effect

In the fourth embodiment, the random phase plate 50 is arranged in the optical path of the optical resonator included in the amplifier 30a. Thus, the beam reciprocating in the optical resonator is spatially and randomly shifted in phase every time it passes through the random phase plate 50, thereby reducing coherence. Speckle distribution of the reciprocating beam varies every time the beam passes through the random phase plate 50, thereby reducing substantial speckles of the pulse laser beam output from the amplifier 30a.

5.4 Variant

Now, a variant of the laser system 2c according to the fourth embodiment will be described. In the fourth embodiment, the laser system 2c uses the OPS 10 according to the comparative example. However, any of the OPSs 10b to 10d including the phase optical element described in the first to third embodiments may be used instead of the OPS 10. When the amplifier and the OPS include the phase optical elements in this manner, the phase optical element included in the amplifier is referred to as a first phase optical element and the phase optical element included in the OPS is referred to as a second phase optical element.

In the fourth embodiment, the random phase plate 50 is arranged between the rear mirror 33 and the laser chamber 31. Alternatively, the random phase plate 50 may be arranged between the output coupling mirror 34 and the laser chamber 31.

In the fourth embodiment, the beam expander 20 is arranged between the OPS 10 and the amplifier 30a. However, the beam expander 20 needs not be arranged if the seed beam can fill the discharge space 35 without the beam expander 20.

6. Fifth Embodiment

Next, a laser system according to a fifth embodiment of the present disclosure will be described. In the fourth embodiment, the amplifier 30a including the Fabry-Perot resonator as the optical resonator is used. In the fifth embodiment, an amplifier including a ring resonator as an optical resonator is used.

6.1 Configuration

Figure 21:
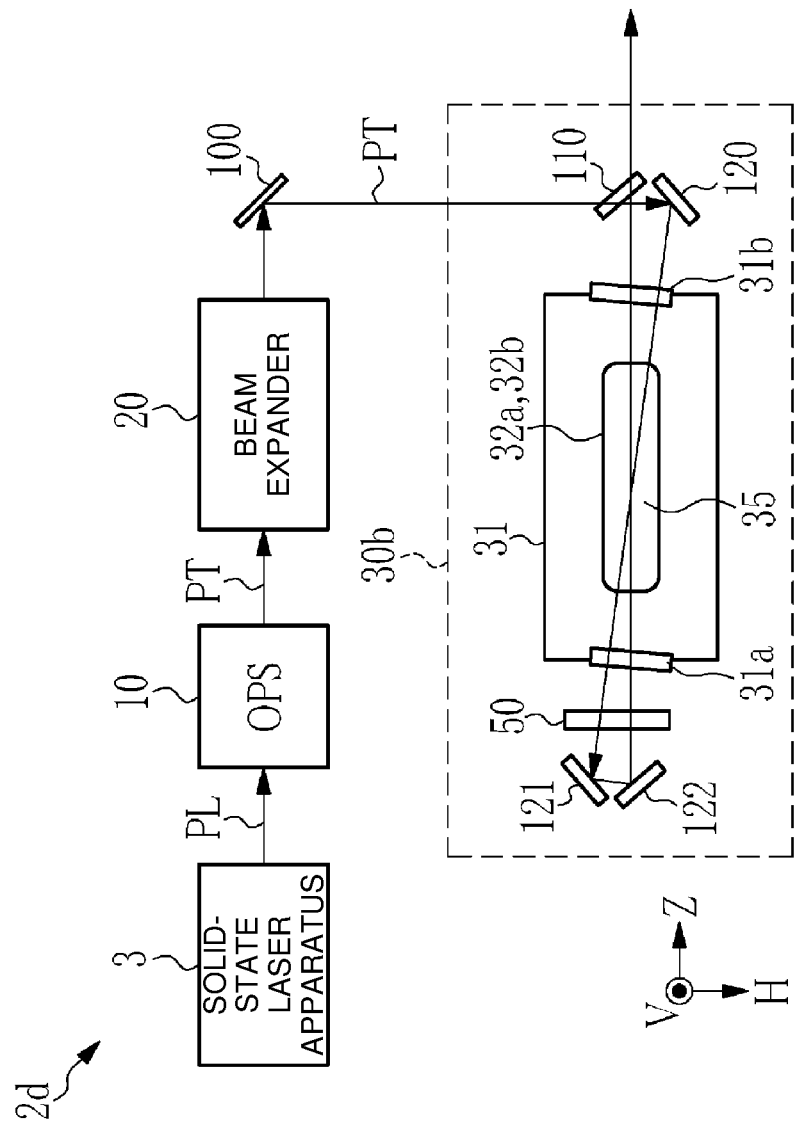
FIG. 21 shows a configuration of a laser system according to a fifth embodiment.

FIG. 21 shows a configuration of a laser system 2d according to the fifth embodiment. The laser system 2d includes a solid-state laser apparatus 3, an OPS 10, a beam expander 20, an amplifier 30b, and a high reflection mirror 100. The laser system 2d has the same configuration as the laser system 2c according to the fourth embodiment other than a configuration of the amplifier 30b and including the high reflection mirror 100. The high reflection mirror 100 highly reflects an expanded pulse laser beam PT output from the beam expander 20 and causes the expanded pulse laser beam PT to enter the amplifier 30b.

The amplifier 30b includes a laser chamber 31, an output coupling mirror 110, high reflection mirrors 120 to 122, and a random phase plate 50. The high reflection mirrors 120 to 122 are plane mirrors. The output coupling mirror 110 and the high reflection mirrors 120 to 122 constitute the ring resonator. The ring resonator forms two optical paths crossing in a discharge space 35 of the laser chamber 31. The optical paths formed by the ring resonator are substantially parallel to an HZ plane perpendicular to a discharge direction. Reflectivity of the output coupling mirror 110 is in the range of 20% to 40%.

The random phase plate 50 has a configuration similar to that in the first embodiment. The random phase plate 50 is a member separate from the output coupling mirror 110, the high reflection mirrors 120 to 122, and windows 31a, 31b as optical elements that constitute the amplifier 30b. The random phase plate 50 is separately provided in the optical paths of the ring resonator constituted by the output coupling mirror 110 and the high reflection mirrors 120 to 122. Specifically, the random phase plate 50 is arranged between the laser chamber 31 and the high reflection mirrors 121, 122 so that the two optical paths crossing in the discharge space 35 pass through the random phase plate 50.

6.2 Operation

Next, an operation of the laser system 2d according to the fifth embodiment will be described. The expanded pulse laser beam PT output from the OPS 10 is expanded in diameter by the beam expander 20, passes through the high reflection mirror 100, and enters the output coupling mirror 110 in the amplifier 30b. One part of the expanded pulse laser beam PT having entered the output coupling mirror 110 passes through the output coupling mirror 110 and is then highly reflected by the high reflection mirror 120. The expanded pulse laser beam PT highly reflected by the high reflection mirror 120 passes through the window 31b and enters the discharge space 35.

The expanded pulse laser beam PT having entered the discharge space 35 travels along the optical path inclined to a Z direction that is a longitudinal direction of discharge electrodes 32a, 32b and is amplified. The expanded pulse laser beam PT amplified passes through the window 31a, is output from the laser chamber 31, and enters the random phase plate 50. The expanded pulse laser beam PT passes through the random phase plate 50 and is thus spatially and randomly shifted in phase.

The expanded pulse laser beam PT having passed through the random phase plate 50 is highly reflected by the high reflection mirrors 121 and 122 and again enters the random phase plate 50. The expanded pulse laser beam PT passes through the random phase plate 50 and is thus further spatially and randomly shifted in phase. The expanded pulse laser beam PT having passed through the random phase plate 50 passes through the window 31a and enters the discharge space 35. The expanded pulse laser beam PT having entered the discharge space 35 travels along the optical path substantially parallel to the Z direction and is amplified. The expanded pulse laser beam PT amplified passes through the window 31b, is output from the laser chamber 31, and enters the output coupling mirror 110.

One part of the expanded pulse laser beam PT having entered the output coupling mirror 110 passes through the output coupling mirror 110 and is output to the exposure apparatus. The other part of the expanded pulse laser beam PT having entered the output coupling mirror 110 is reflected by the output coupling mirror 110 and again circulates through the optical paths of the ring resonator. The above operation is repeated to amplify and oscillate the beam, and a plurality of amplified pulse laser beams are output from the output coupling mirror 110 and enter the exposure apparatus.

6.3 Effect

In the fifth embodiment, the random phase plate 50 is arranged in the optical paths of the ring resonator included in the amplifier 30b. Thus, the beam circulating in the ring resonator is spatially and randomly shifted in phase every time it passes through the random phase plate 50, thereby reducing coherence. Speckle distribution of the circulation beam varies every time the beam passes through the random phase plate 50, thereby reducing substantial speckles of the pulse laser beam output from the amplifier 30b.

6.4 Variant

Now, a variant of the laser system 2d according to the fifth embodiment will be described. In the fifth embodiment, the random phase plate 50 is arranged so that the two optical paths crossing in the discharge space 35 pass through the random phase plate 50. However, the random phase plate 50 may be arranged so that only one of the optical paths passes through the random phase plate 50. In the fifth embodiment, the random phase plate 50 is arranged between the laser chamber 31 and the high reflection mirrors 121, 122, but may be arranged between the laser chamber 31 and the output coupling mirror 110, and the high reflection mirror 120.

Further, a variant similar to that of the fourth embodiment is applicable to the fifth embodiment. For example, any of the OPSs 10b to 10d described in the first to third embodiments may be used instead of the OPS 10. Also, the beam expander 20 needs not be arranged if the seed beam can fill the discharge space 35 without the beam expander 20.

7. Sixth Embodiment

Next, a laser system according to a sixth embodiment of the present disclosure will be described. In the fourth and fifth embodiments, the random phase plate is a separate member and is separately provided in the amplifier as the phase optical element having the spatial random phase shift function. In the sixth embodiment, a window of a laser chamber as an optical element included in an amplifier has a spatial random phase shift function.

7.1 Configuration

Figure 22:
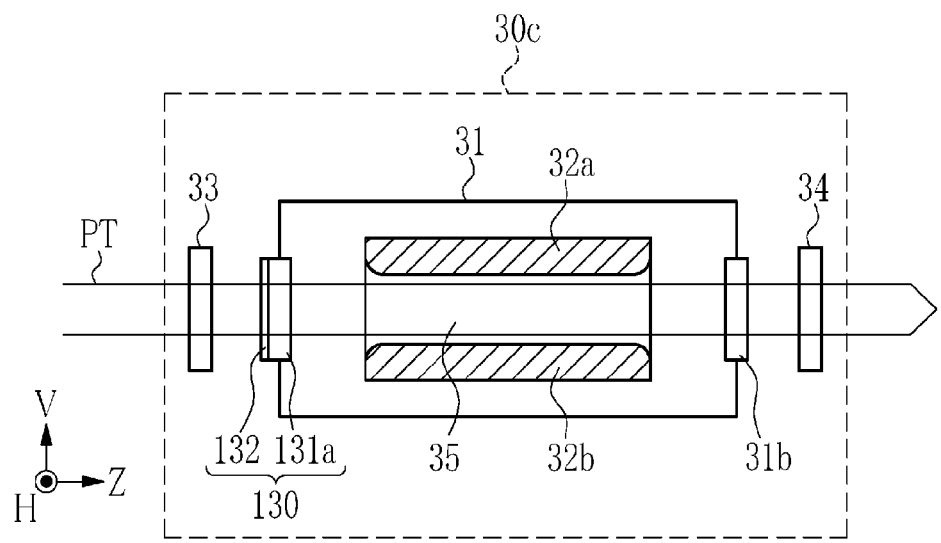
FIG. 22 shows a configuration of an amplifier used in a laser system according to a sixth embodiment.

FIG. 22 shows a configuration of an amplifier 30c used in the laser system according to the sixth embodiment. The laser system according to the sixth embodiment has the same configuration as the laser system 2c according to the fourth embodiment other than using the amplifier 30c instead of the amplifier 30a.

The amplifier 30c includes a window 130 having a phase coat layer 132 on a rear side of a laser chamber 31. The amplifier 30c has the same configuration as the amplifier 30 according to the comparative example other than a configuration of the window 130. The window 130 includes a substrate 131a and the phase coat layer 132. The substrate 131a is a parallel plane substrate made of, for example, CaF$_2$.

The phase coat layer 132 is formed on a surface of the substrate 131a opposite to the laser chamber 31. A material for the phase coat layer 132 is similar to that for the phase coat layer 52 according to the first embodiment.

Similarly to the phase coat layer 52 according to the first embodiment, the phase coat layer 132 configures a plurality of cells providing different amounts of phase shift according to setting of a thickness. Thus, the window 130 also serves as a phase optical element having a spatial random phase shift function.

7.2 Operation

In the sixth embodiment, an expanded pulse laser beam PT having entered the amplifier 30c as a seed beam is spatially and randomly shifted in phase every time it passes through the window 130 while reciprocating in an optical resonator constituted by a rear mirror 33 and an output coupling mirror 34. Other operations are similar to those of the fourth embodiment.

7.3 Effect

In the sixth embodiment, the window 130 provided in the laser chamber 31 has the spatial random phase shift function, thereby reducing the number of optical elements included in the amplifier as compared with the fourth embodiment. Also, in the sixth embodiment, the phase coat layer 132 is provided on the surface of the substrate 131a opposite to the laser chamber 31, thereby preventing damage due to adhesion of metal dust emitted from discharge electrodes 32a, 32b.

7.4 Variant

Now, a variant of the laser system according to the sixth embodiment will be described. In the sixth embodiment, the rear side window has the spatial random phase shift function, but a front side window may have the spatial random phase shift function. In this case, a phase coat layer is preferably formed on a surface of the front side window opposite to the laser chamber. Both the front side window and the rear side window may have the spatial random phase shift function.

Figure 23:
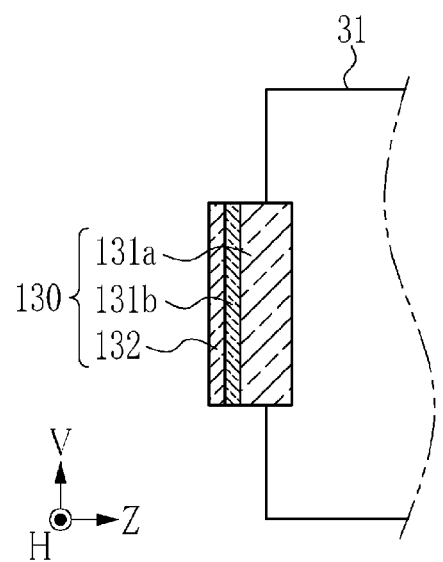
FIG. 23 is a sectional view of a variant of a window having a spatial random phase shift function.

FIG. 23 shows a variant of the window 130 including the phase coat layer 132. The window 130 includes a protective coat layer 131b. The protective coat layer 131b is formed on the surface of the substrate 131a opposite to the laser chamber 31. The phase coat layer 132 is formed on a surface of the protective coat layer 131b. The protective coat layer 131b is preferably made of fluoride, for example, magnesium fluoride (MgF$_2$) or gadolinium fluoride (GdF$_3$). The substrate 131a including the protective coat layer 131b prevents damage. A protective coat layer may be similarly formed when the front side window has the spatial random phase shift function.

Figure 24:
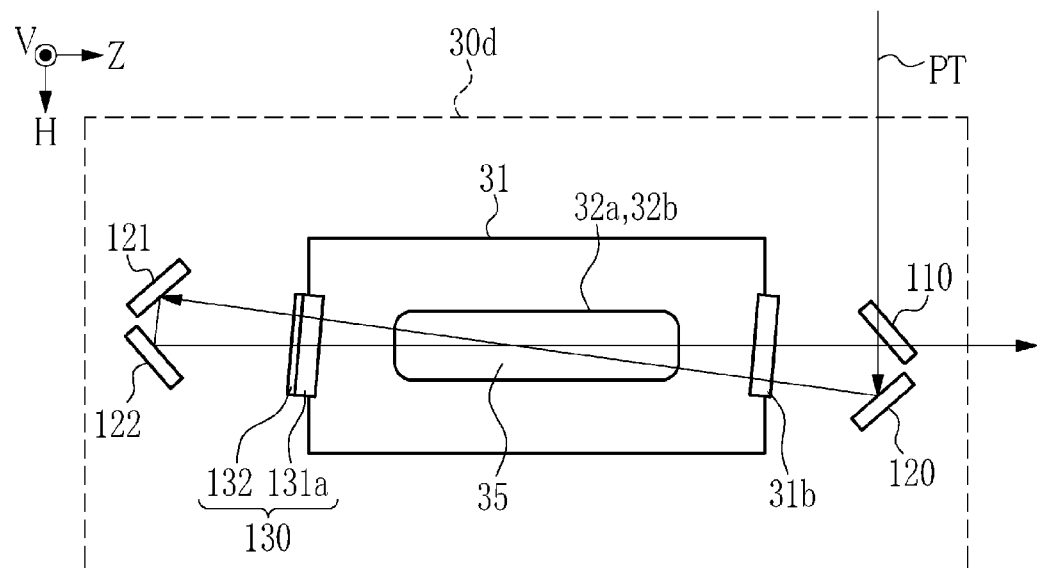
FIG. 24 shows a variant of an amplifier including a ring resonator.

FIG. 24 shows an amplifier 30d including a ring resonator in which a window 130 including a phase coat layer 132 is provided on a rear side of a laser chamber 31. The amplifier 30d is used instead of the amplifier 30b included in the laser system 2d according to the fifth embodiment. A variant similar to that of the amplifier 30c according to the sixth embodiment is applicable to the amplifier 30d.

8. Seventh Embodiment

Next, a laser system according to a seventh embodiment of the present disclosure will be described. In the sixth embodiment, the window of the laser chamber has the spatial random phase shift function. In the seventh embodiment, out of a rear mirror and an output coupling mirror that constitute a Fabry-Perot resonator as an optical resonator, the rear mirror has a spatial random phase shift function.

8.1 Configuration

Figure 25:
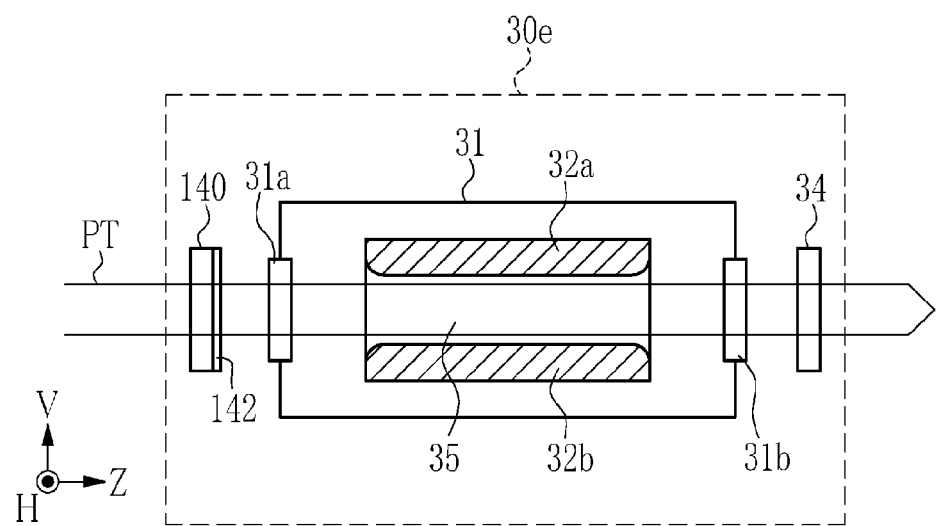
FIG. 25 shows a configuration of an amplifier used in a laser system according to a seventh embodiment.

FIG. 25 shows a configuration of an amplifier 30e used in the laser system according to the seventh embodiment. The laser system according to the seventh embodiment has the same configuration as the laser system 2c according to the fourth embodiment other than using the amplifier 30e instead of the amplifier 30a.

The amplifier 30e includes a rear mirror 140 having a phase coat layer 142. The amplifier 30e has the same configuration as the amplifier 30 according to the comparative example other than a configuration of the rear mirror 140.

Figure 26:
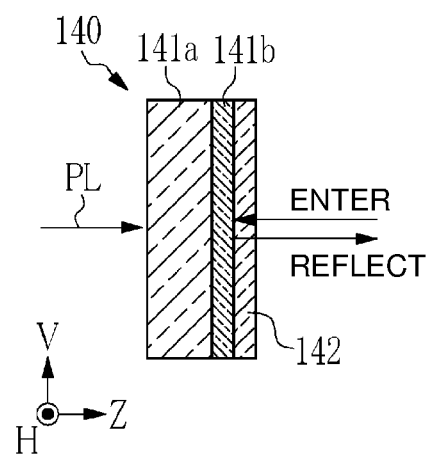
FIG. 26 is a sectional view of a configuration of a rear mirror having a spatial random phase shift function.

As shown in FIG. 26, the rear mirror 140 includes a substrate 141a, a partial reflection film 141b, and a phase coat layer 142. The substrate 131a is a parallel plane substrate made of, for example, $CaF_2$. The partial reflection film 141b is formed on a surface of the substrate 141a on a side of the laser chamber 31. The phase coat layer 142 is formed on a surface of the partial reflection film 141b. A material for the phase coat layer 142 is similar to that for the phase coat layer 52 according to the first embodiment.

Similarly to the phase coat layer 52 according to the first embodiment, the phase coat layer 142 configures a plurality of cells providing different amounts of phase shift according to setting of a thickness. Thus, the rear mirror 140 also serves as a phase optical element having a spatial random phase shift function.

8.2 Operation

In the seventh embodiment, an expanded pulse laser beam PT having entered the amplifier 30e as a seed beam is spatially and randomly shifted in phase every time it is reflected by the rear mirror 140 while reciprocating in an optical resonator constituted by the rear mirror 140 and an output coupling mirror 34. Other operations are similar to those of the fourth embodiment.

8.3 Effect

In the seventh embodiment, the rear mirror 140 as the optical element included in the optical resonator has the spatial random phase shift function, thereby reducing the number of optical elements included in the amplifier as compared with the fourth embodiment.

8.4 Variant

Now, a variant of the rear mirror 140 according to the seventh embodiment will be described. A rear mirror 140a in FIG. 27 includes a phase coat layer 142 on a surface of a substrate 141a on the side of the laser chamber 31, and a partial reflection film 141b on the other surface. A rear mirror 140b in FIG. 28 includes an AR coat layer 143 between the substrate 141a and the phase coat layer 142 in addition to the configuration of the rear mirror 140a in FIG. 27. The AR coat layer 143 has a configuration similar to that of the AR coat layer 60 described above.

Figure 27:
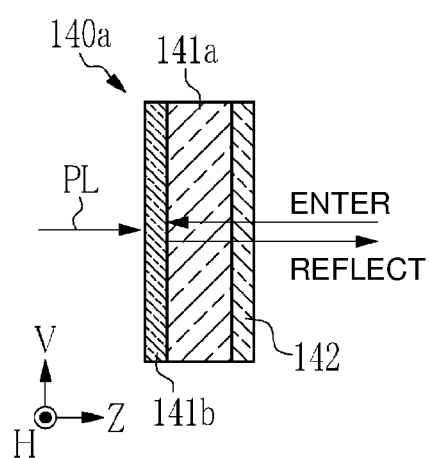
FIG. 27 is a sectional view of a configuration according to a first variant of the rear mirror.
Figure 28:
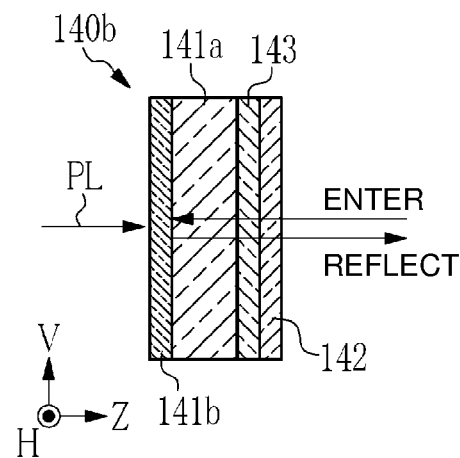
FIG. 28 is a sectional view of a configuration according to a second variant of the rear mirror.

Comparing the rear mirrors 140, 140a, 140b in FIGS. 26 to 28, the rear mirror 140 is the most resistant to a laser beam. However, the rear mirrors 140a, 140b have a distance for a thickness of the substrate 141a between the partial reflection film 141b and the phase coat layer 142, thereby having a superior spatial random phase shift function than the rear mirror 140. Further, the rear mirror 140b includes the AR coat layer 143, thereby reducing light amount loss as compared with the rear mirror 140a.

9. Eighth Embodiment

Next, a laser system according to an eighth embodiment of the present disclosure will be described. In the seventh embodiment, the rear mirror has the spatial random phase shift function. In the eighth embodiment, an output coupling mirror has a spatial random phase shift function.

9.1 Configuration

Figure 29:
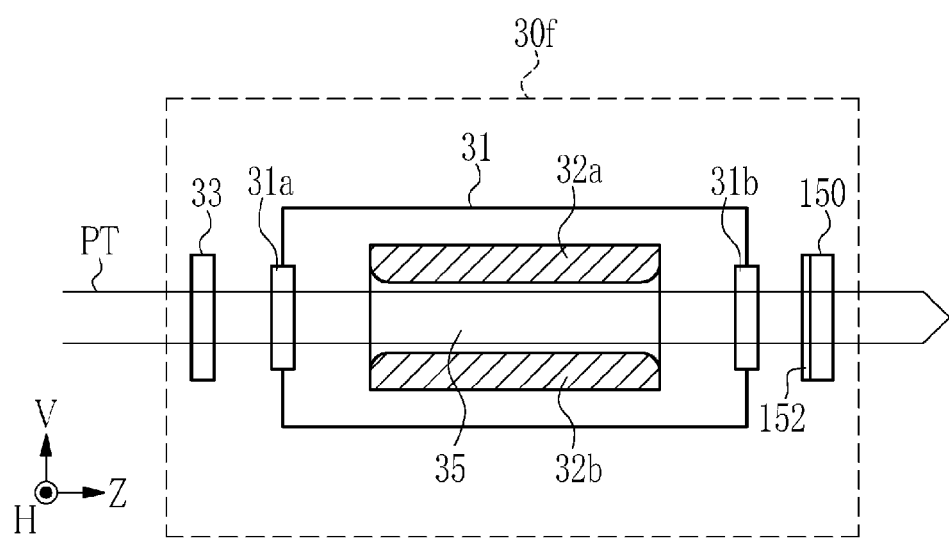
FIG. 29 shows a configuration of an amplifier used in a laser system according to an eighth embodiment.

FIG. 29 shows a configuration of an amplifier 30f used in the laser system according to the eighth embodiment. The laser system according to the eighth embodiment has the same configuration as the laser system 2c according to the fourth embodiment other than using the amplifier 30f instead of the amplifier 30a.

The amplifier 30f includes an output coupling mirror 150 having a phase coat layer 152. The amplifier 30f has the same configuration as the amplifier 30 according to the comparative example other than a configuration of the output coupling mirror 150.

Figure 30:
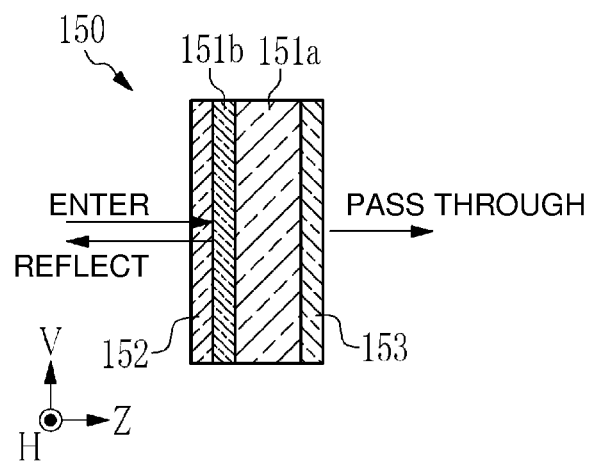
FIG. 30 is a sectional view of a configuration of an output coupling mirror having a spatial random phase shift function.

As shown in FIG. 30, the output coupling mirror 150 includes a substrate 151a, a partial reflection film 151b, a phase coat layer 152, and an AR coat layer 153. The substrate 151a is a parallel plane substrate made of, for example, $CaF_2$. The partial reflection film 151b is formed on a surface of the substrate 151a on a side of a laser chamber 31. The phase coat layer 152 is formed on a surface of the partial reflection film 151b. A material for the phase coat layer 152 is similar to that for the phase coat layer 52 according to the first embodiment.

Similarly to the phase coat layer 52 according to the first embodiment, the phase coat layer 152 configures a plurality of cells providing different amounts of phase shift according to setting of a thickness. Thus, the output coupling mirror 150 also serves as a phase optical element having a spatial random phase shift function.

The AR coat layer 153 is formed on a surface of the substrate 151a opposite to the laser chamber 31. The AR coat layer 153 has a configuration similar to that of the AR coat layer 60 described above.

9.2 Operation

In the eighth embodiment, an expanded pulse laser beam PT having entered the amplifier 30f as a seed beam is spatially and randomly shifted in phase every time it is reflected by the output coupling mirror 150 while reciprocating in an optical resonator constituted by a rear mirror 33 and the output coupling mirror 150. Other operations are similar to those of the fourth embodiment.

9.3 Effect

In the eighth embodiment, the output coupling mirror 150 as an optical element included in the optical resonator has the spatial random phase shift function, thereby reducing the number of optical elements included in the amplifier as compared with the fourth embodiment.

9.4 Variant

Now, a variant of the output coupling mirror according to the eighth embodiment will be described. An output coupling mirror 150a in FIG. 31 includes a phase coat layer 152 on a surface of a substrate 151a on the side of the laser chamber 31, and a partial reflection film 151b on the other surface. An output coupling mirror 150b in FIG. 32 includes an AR coat layer 153 between the substrate 151a and the phase coat layer 152 in addition to the configuration of the output coupling mirror 150a in FIG. 31.

Figure 31:
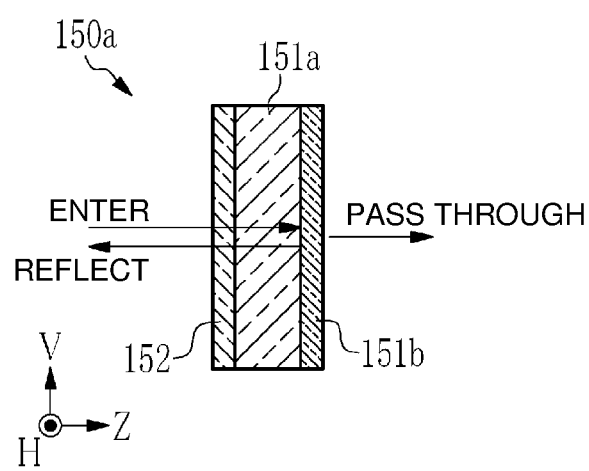
FIG. 31 is a sectional view of a configuration according to a first variant of the output coupling mirror.
Figure 32:
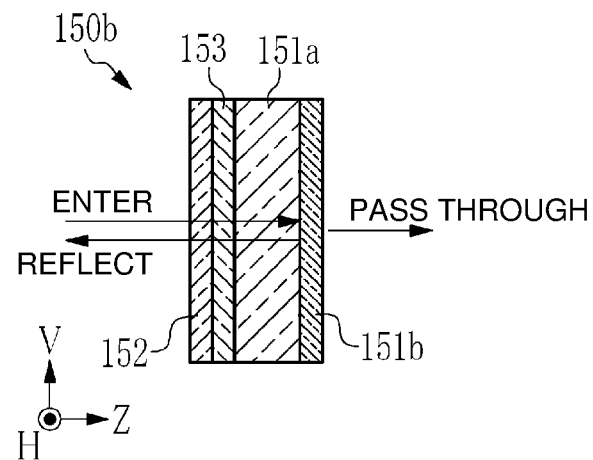
FIG. 32 is a sectional view of a configuration according to a second variant of the output coupling mirror.

Comparing the output coupling mirrors 150, 150a, 150b in FIGS. 30 to 32, the output coupling mirror 150 is the most resistant to a laser beam. However, the output coupling mirrors 150a, 150b have a distance for a thickness of the substrate 151a between the partial reflection film 151b and the phase coat layer 152, thereby having a superior spatial random phase shift function than the output coupling mirror 150. Further, the output coupling mirror 150b includes the AR coat layer 153, thereby reducing light amount loss as compared with the output coupling mirror 150a.

Comparing the seventh embodiment with the eighth embodiment, the mirror in the seventh embodiment is superior in durability. This is because the rear mirror has a lower energy load of the laser beam and has a longer lifetime than the output coupling mirror.

Also, in the seventh embodiment, the rear mirror has the spatial random phase shift function, and in the eighth embodiment, the output coupling mirror has the spatial random phase shift function. However, both the rear mirror and the output coupling mirror may have the spatial random phase shift function.

10. Ninth Embodiment

Next, a laser system according to a ninth embodiment of the present disclosure will be described. In the seventh and eighth embodiments, the optical element included in the Fabry-Perot resonator has the spatial random phase shift function. In the ninth embodiment, a high reflection mirror as an optical element included in a ring resonator has a spatial random phase shift function.

10.1 Configuration

Figure 33:
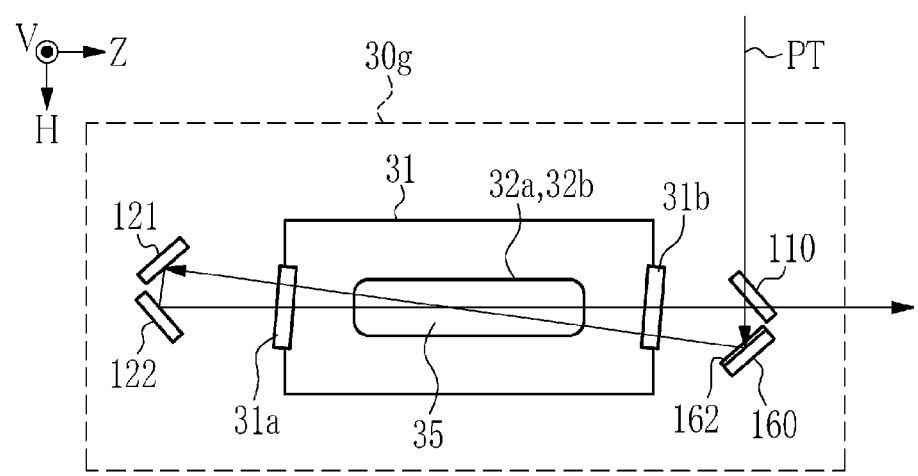
FIG. 33 shows a configuration of an amplifier used in a laser system according to a ninth embodiment.

FIG. 33 shows a configuration of an amplifier 30g used in the laser system according to the ninth embodiment. The laser system according to the ninth embodiment has the same configuration as the laser system 2d according to the fifth embodiment other than using the amplifier 30g instead of the amplifier 30b.

The amplifier 30g includes a high reflection mirror 160 having a phase coat layer 162 in a ring resonator. The amplifier 30g has the same configuration as the amplifier 30b according to the fifth embodiment other than a configuration of the high reflection mirror 160.

Figure 34:
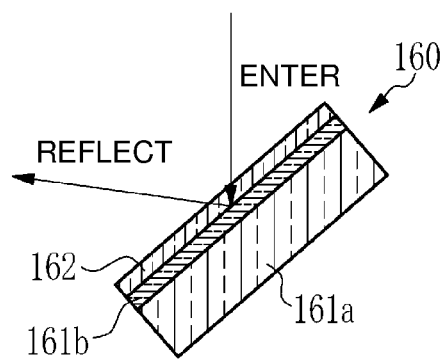
FIG. 34 is a sectional view of a configuration of a high reflection mirror having a spatial random phase shift function.

As shown in FIG. 34, the high reflection mirror 160 includes a substrate 161a, a high reflection film 161b, and a phase coat layer 162. The substrate 161a is a parallel plane substrate made of, for example, $CaF_2$. The high reflection film 161b is formed on a surface of the substrate 161a that an expanded pulse laser beam PT enters. The phase coat layer 162 is formed on a surface of the high reflection film 161b. A material for the phase coat layer 162 is similar to that for the phase coat layer 52 according to the first embodiment.

Similarly to the phase coat layer 52 according to the first embodiment, the phase coat layer 162 configures a plurality of cells providing different amounts of phase shift according to setting of a thickness. Thus, the high reflection mirror 160 also serves as a phase optical element having a spatial random phase shift function.

10.2 Operation

In the ninth embodiment, the expanded pulse laser beam PT having entered the amplifier 30g as a seed beam passes through an output coupling mirror 110 and is reflected by the high reflection mirror 160. The expanded pulse laser beam PT is spatially and randomly shifted in phase every time it is reflected by the high reflection mirror 160 while circulating in the ring resonator including the high reflection mirror 160. Other operations are similar to those of the fifth embodiment.

10.3 Effect

In the ninth embodiment, the high reflection mirror 160 as an optical element included in the ring resonator has the spatial random phase shift function, thereby reducing the number of optical elements included in the amplifier as compared with the fifth embodiment.

10.4 Variant

Now, a variant of the high reflection mirror 160 according to the ninth embodiment will be described. A high reflection mirror 160a in FIG. 35 includes a phase coat layer 162 on a surface of a substrate 161a that the expanded pulse laser beam PT enters, and a high reflection film 161b on the other surface. A high reflection mirror 160b in FIG. 36 includes an AR coat layer 163 between the substrate 161a and the phase coat layer 162 in addition to the configuration of the high reflection mirror 160a in FIG. 35. The AR coat layer 163 has a configuration similar to that of the AR coat layer 60 described above.

Figure 35:
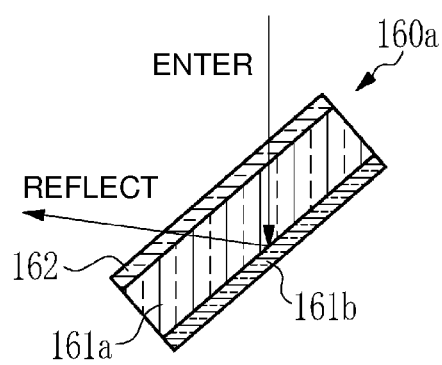
FIG. 35 is a sectional view of a configuration according to a first variant of the high reflection mirror.
Figure 36:
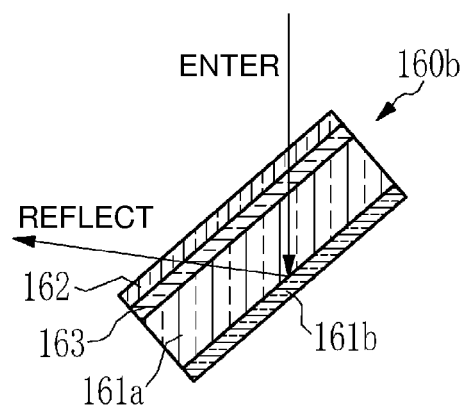
FIG. 36 is a sectional view of a configuration according to a second variant of the high reflection mirror.

Comparing the high reflection mirrors 160, 160a, 160b in FIGS. 34 to 36, the high reflection mirror 160 is the most resistant to a laser beam. However, the high reflection mirrors 160a, 160b have a distance for a thickness of the substrate 161a between the high reflection film 161b and the phase coat layer 162, thereby having a superior spatial random phase shift function than the high reflection mirror 160. Further, the high reflection mirror 160b includes the AR coat layer 163, thereby reducing light amount loss as compared with the high reflection mirror 160a.

In the ninth embodiment, among the three high reflection mirrors included in the ring resonator, the high reflection mirror 160 that the expanded pulse laser beam PT first enters has the spatial random phase shift function, but any of the high reflection mirrors may have the spatial random phase shift function. However, since the high reflection mirror 160 that the expanded pulse laser beam PT first enters has the lowest energy density of the laser beam and the lowest energy load, the high reflection mirror 160 preferably has the spatial random phase shift function. Also, the plurality of high reflection mirrors may have the spatial random phase shift function.

11. Tenth Embodiment

Next, a laser system according to a tenth embodiment of the present disclosure will be described. In the ninth embodiment, the high reflection mirror as the optical element included in the ring resonator has the spatial random phase shift function. In the tenth embodiment, an output coupling mirror as an optical element included in a ring resonator has a spatial random phase shift function.

11.1 Configuration

Figure 37:
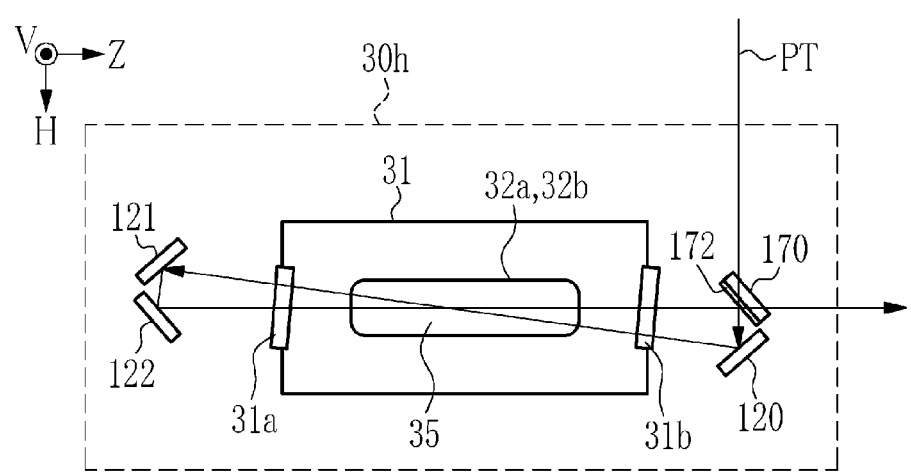
FIG. 37 shows a configuration of an amplifier used in a laser system according to a tenth embodiment.

FIG. 37 shows a configuration of an amplifier 30h used in the laser system according to the tenth embodiment. The laser system according to the tenth embodiment has the same configuration as the laser system 2d according to the fifth embodiment other than using the amplifier 30h instead of the amplifier 30b.

The amplifier 30h includes an output coupling mirror 170 having a phase coat layer 172 in a ring resonator. The amplifier 30h has the same configuration as the amplifier 30b according to the fifth embodiment other than a configuration of the output coupling mirror 170.

Figure 38:
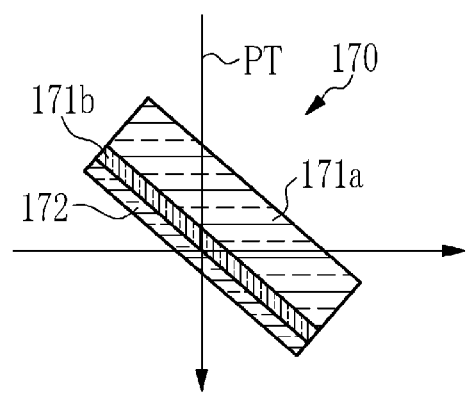
FIG. 38 is a sectional view of a configuration of an output coupling mirror having a spatial random phase shift function.

As shown in FIG. 38, the output coupling mirror 170 includes a substrate 171a, a partial reflection film 171b, and a phase coat layer 172. The substrate 171a is a parallel plane substrate made of, for example, $CaF_2$. The partial reflection film 171b is formed on a surface of the substrate 171a on a side of a laser chamber 31. The phase coat layer 172 is formed on a surface of the partial reflection film 171b. A material for the phase coat layer 172 is similar to that for the phase coat layer 52 according to the first embodiment.

Similarly to the phase coat layer 52 according to the first embodiment, the phase coat layer 172 configures a plurality of cells providing different amounts of phase shift according to setting of a thickness. Thus, the output coupling mirror 170 also serves as a phase optical element having a spatial random phase shift function.

11.2 Operation

In the tenth embodiment, an expanded pulse laser beam PT having entered the amplifier 30h as a seed beam circulates in the ring resonator including the output coupling mirror 170. The circulation beam is spatially and randomly shifted in phase every time it passes through the output coupling mirror 170 or it is reflected by the output coupling mirror 170. Other operations are similar to those of the fifth embodiment.

11.3 Effect

In the tenth embodiment, the output coupling mirror 170 as an optical element included in the ring resonator has the spatial random phase shift function, thereby reducing the number of optical elements included in the amplifier as compared with the fifth embodiment.

11.4 Variant

Figure 39:
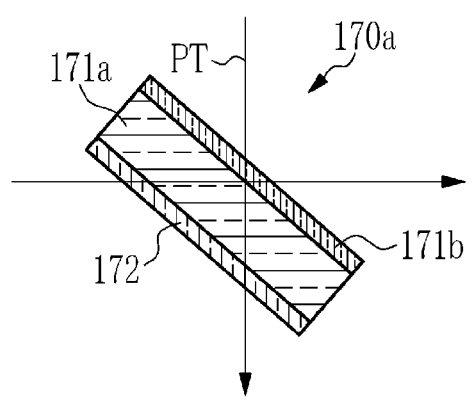
FIG. 39 is a sectional view of a configuration according to a first variant of the output coupling mirror.
Figure 40:
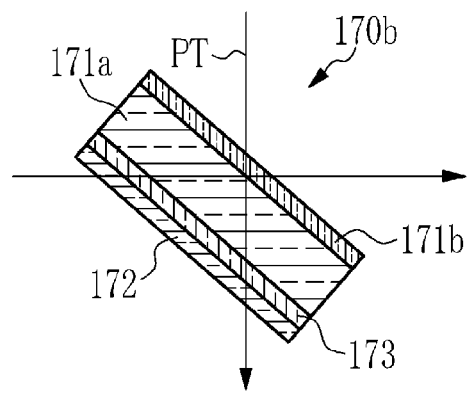
FIG. 40 is a sectional view of a configuration according to a second variant of the output coupling mirror.

Now, a variant of the output coupling mirror 170 according to the tenth embodiment will be described. An output coupling mirror 170a in FIG. 39 includes a phase coat layer 172 on a surface of a substrate 171a on the side of the laser chamber 31, and a partial reflection film 171b on the other surface. An output coupling mirror 170b in FIG. 40 includes an AR coat layer 173 between the substrate 171a and the phase coat layer 172 in addition to the configuration of the output coupling mirror 170a in FIG. 39. The AR coat layer 173 has a configuration similar to that of the AR coat layer 60 described above.

12. Variant of Ring Resonator

Figure 41:
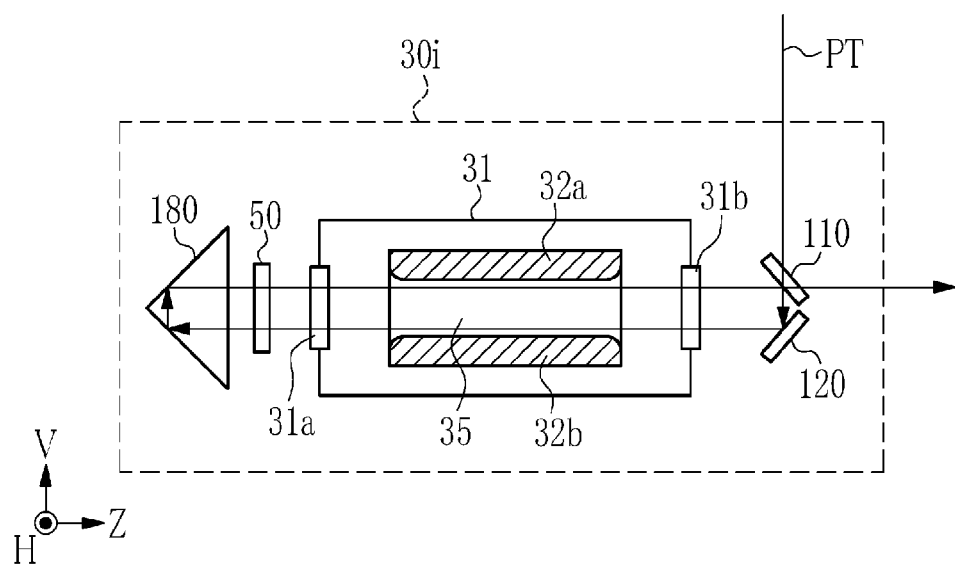
FIG. 41 is a variant of a ring resonator.

Now, a variant of the ring resonator included in the amplifier 30b according to the fifth embodiment or the like will be described. An amplifier 30i in FIG. 41 has a configuration similar to that of the amplifier 30b according to the fifth embodiment other than including an output coupling mirror 110, a high reflection mirror 120, and a high reflection prism 180 as a ring resonator.

The amplifier 30i includes the high reflection prism 180 instead of the high reflection mirrors 121, 122 included in the amplifier 30b in FIG. 21. In this variant, an optical path of a beam reflected by the high reflection mirror 120 is substantially parallel to a Z direction that is a longitudinal direction of discharge electrodes 32a, 32b. The beam enters the high reflection prism 180 along the optical path substantially parallel to the Z direction. The high reflection prism 180 bends the optical path of the entering beam and emits the beam along the optical path substantially parallel to the Z direction. Thus, in this variant, the two optical paths in a discharge space 35 in the laser chamber 31 are substantially parallel. The optical path formed by the ring resonator is substantially rectangular and substantially parallel to a VZ plane parallel to a discharge direction.

In the laser systems according to the embodiments described above, the solid-state laser apparatus 3 is used as the master oscillator. However, the master oscillator is not limited to the solid-state laser apparatus, but may be any other laser apparatus such as an excimer laser apparatus.

In the embodiments described above, the plurality of cells providing different amounts of phase shift are configured by forming the phase coat layer having different thicknesses on the substrate. Since the amount of phase shift depends on the thickness and the refractive index of a medium through which the laser beam passes, the plurality of cells providing different amounts of phase shift may be configured by varying the refractive index of the substrate according to regions of the cells. For example, ions or the like may be doped on the substrate to set the refractive index of the substrate for each region of the cell. In this case, the amount of phase shift can be set according to a concentration of dopant. The dopant may include germanium dioxide ($GeO_2$), fluorine (F), neodymium (Nd), aluminium (Al), cerium (Ce), or the like.

Thus, a layer providing phase shift to a laser beam is referred to as a phase shift layer. The phase shift layer includes a phase coat layer having a thickness set according to the amount of phase shift, and a substrate having a refractive index set according to the amount of phase shift as described above.

The above descriptions are intended to be illustrative only and not restrictive. Thus, it will be apparent to those skilled in the art that modifications may be made in the embodiments of the present disclosure without departing from the scope of the appended claims.

The terms used throughout the specification and the appended claims should be interpreted as "non-limiting". For example, the term "comprising" or "comprised" should be interpreted as "not limited to what has been described as being comprised". The term "having" should be interpreted as "not limited to what has been described as having". Further, the modifier "a/an" described in the specification and the appended claims should be interpreted to mean "at least one" or "one or more".

What is claimed is:

1. A laser system comprising:
a laser apparatus configured to output a pulse laser beam;
an amplifier including an optical resonator and a laser chamber having a plurality of windows, the amplifier being configured to amplify the pulse laser beam output from the laser apparatus; and
a first phase optical element included in an optical path of the optical resonator and having a function of spatially and randomly shifting a phase of the pulse laser beam, at least one of the windows serving as the first phase optical element.

2. The laser system according to claim 1, wherein
the window that also serves as the first phase optical element includes a phase shift layer configured to spatially and randomly shift a phase of the pulse laser beam, and
the phase shift layer is formed on a surface of the window opposite to the laser chamber.

3. A laser system comprising:
a laser apparatus configured to output a pulse laser beam;
an amplifier including an optical resonator, the optical resonator being a Fabry-Perot resonator constituted by a rear mirror and an output coupling mirror, the amplifier being configured to amplify the pulse laser beam output from the laser apparatus; and
a first phase optical element included in an optical path of the optical resonator and having a function of spatially and randomly shifting a phase of the pulse laser beam, at least one of the rear mirror and the output coupling mirror serving as the first phase optical element.

4. A laser system according comprising:
a laser apparatus configured to output a pulse laser beam;
an amplifier including an optical resonator, the optical resonator being a ring resonator constituted by a plurality of high reflection mirrors and an output coupling mirror, and the amplifier being configured to amplify the pulse laser beam output from the laser apparatus; and a first phase optical element included in an optical path of the optical resonator and having a function of spatially and randomly shifting a phase of the pulse laser beam, at least one of the high reflection mirrors and the output coupling mirror serving as the first phase optical element.

5. The laser system according to claim 4, wherein among the high reflection mirrors, the high reflection mirror that the pulse laser beam first enters also serves as the first phase optical element.

* * * * *